(12) United States Patent  
Lo

(10) Patent No.: US 12,300,651 B2  
(45) Date of Patent: May 13, 2025

(54) ELECTRONIC DEVICE, PACKAGE STRUCTURE AND ELECTRONIC MANUFACTURING METHOD

(71) Applicant: Advanced Semiconductor Engineering, Inc., Kaohsiung (TW)

(72) Inventor: Pei-Jen Lo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/229,172

(22) Filed: Aug. 1, 2023

(65) Prior Publication Data

US 2023/0378113 A1    Nov. 23, 2023

Related U.S. Application Data

(63) Continuation of application No. 17/378,513, filed on Jul. 16, 2021, now Pat. No. 11,715,716.

(51) Int. Cl.
| | |
|---|---|
| *H01L 23/498* | (2006.01) |
| *H01L 23/00* | (2006.01) |
| *H01L 25/18* | (2023.01) |

(52) U.S. Cl.
CPC ........ *H01L 24/13* (2013.01); *H01L 23/49811* (2013.01); *H01L 23/49822* (2013.01); *H01L 24/14* (2013.01); *H01L 24/16* (2013.01); *H01L 24/81* (2013.01); *H01L 25/18* (2013.01); *H01L 2224/13019* (2013.01); *H01L 2224/1403* (2013.01); *H01L 2224/16227* (2013.01); *H01L 2224/81345* (2013.01); *H01L 2224/81815* (2013.01)

(58) Field of Classification Search
CPC .................................................... H01L 24/13
See application file for complete search history.

(56) References Cited

U.S. PATENT DOCUMENTS

| | | | | |
|---|---|---|---|---|
| 7,382,049 B2* | 6/2008 | Ho | ........................ | H01L 24/13 |
| | | | | 257/E21.511 |
| 10,779,414 B2* | 9/2020 | Park | ...................... | H05K 1/187 |
| 11,004,814 B2* | 5/2021 | Choi | ...................... | H01L 24/03 |
| 2005/0208749 A1* | 9/2005 | Beckman | ............... | H05K 1/111 |
| | | | | 257/E21.511 |
| 2008/0093738 A1* | 4/2008 | Lin | ........................ | H01L 24/13 |
| | | | | 257/737 |

(Continued)

OTHER PUBLICATIONS

Non-Final Office Action for U.S. Appl. No. 17/378,513, issued Sep. 2, 2022, 13 pages.

(Continued)

*Primary Examiner* — William A Harriston  
(74) *Attorney, Agent, or Firm* — FOLEY & LARDNER LLP

(57) ABSTRACT

An electronic device, a package structure and an electronic manufacturing method are provided. The electronic device includes a substrate, a first bump, a second bump and a first reflowable material. The first bump is disposed over the substrate, and has a first width. An end portion of the first bump defines a first recess portion. The second bump is disposed over the substrate, and has a second width less than the first width. The first reflowable material is disposed on the first bump and extends in the first recess portion.

14 Claims, 33 Drawing Sheets

(56) References Cited

U.S. PATENT DOCUMENTS

| | | | | |
|---|---|---|---|---|
| 2008/0197173 A1* | 8/2008 | Kitae | ............... | H01L 24/16 |
| | | | | 228/208 |
| 2010/0012364 A1* | 1/2010 | Kim | ............... | H01L 24/24 |
| | | | | 29/830 |
| 2012/0012997 A1* | 1/2012 | Shen | ............... | H01L 23/49816 |
| | | | | 257/E21.507 |
| 2013/0134594 A1* | 5/2013 | Machida | ............... | H01L 21/768 |
| | | | | 257/772 |
| 2013/0292827 A1 | 11/2013 | Kuo et al. | | |
| 2015/0091160 A1* | 4/2015 | Reber | ............... | H01L 24/16 |
| | | | | 257/737 |
| 2015/0255433 A1* | 9/2015 | Daizo | ............... | H01L 25/105 |
| | | | | 257/737 |
| 2016/0104685 A1* | 4/2016 | Shen | ............... | H01L 24/16 |
| | | | | 257/737 |
| 2017/0345786 A1* | 11/2017 | Chen | ............... | H01L 25/105 |
| 2020/0303334 A1* | 9/2020 | Liu | ............... | H01L 24/09 |
| 2021/0068265 A1* | 3/2021 | Sawada | ............... | H05K 1/113 |

OTHER PUBLICATIONS

Notice of Allowance for U.S. Appl. No. 17/378,513, issued Mar. 15, 2023, 9 pages.

* cited by examiner

ELECTRONIC DEVICE, PACKAGE STRUCTURE AND ELECTRONIC MANUFACTURING METHOD

CROSS-REFERENCE TO RELATED APPLICATION

This application is a continuation of U.S. patent application Ser. No. 17/378,513 filed Jul. 16, 2021, now issued as U.S. Pat. No. 11,715,716, the contents of which is incorporated herein by reference in its entirety.

BACKGROUND

1. Field of the Disclosure

The present disclosure relates to an electronic device, a package structure and an electronic manufacturing method, and to an electronic device including bumps having different sizes, a package structure including the same, and a method for manufacturing the same.

2. Description of the Related Art

Along with the rapid development in electronics industry and the progress of semiconductor processing technologies, semiconductor package structures are integrated with an increasing number of electronic devices to achieve improved electrical performance and additional functions. In order to improve electrical performance, the electronic device may include bumps having different sizes. However, the solder on a large size bump may have a relative large volume after a reflow process before a bonding process. Thus, there may be level difference between an apex of the solder on a large size bump and an apex of the solder on a small size bump. Then, during a flip chip bonding, the solders on small size bumps may not contact the pads of a wiring structure or a substrate. Thus, not all of the bumps of the electronic device can be securely bonded to the pads of the wiring structure or the substrate, which may result in no joint or an open circuit and render the semiconductor package structure inoperative. Thus, the quality of the bonding process may be poor, and the yield rate of the semiconductor package structure may decrease.

SUMMARY

In some embodiments, an electronic device includes a substrate, a first bump, a second bump and a first reflowable material. The first bump is disposed over the substrate, and has a first width. An end portion of the first bump defines a first recess portion. The second bump is disposed over the substrate, and has a second width less than the first width. The first reflowable material is disposed on the first bump and extends in the first recess portion.

In some embodiments, a package structure includes a wiring structure, an electronic device, a first interconnection structure, a second interconnection structure, a first reflowable material and a second reflowable material. The first interconnection structure is disposed between the wiring structure and the electronic device, defines a first gap and a first recess portion 254, and has a first width. The second interconnection structure is disposed between the wiring structure and the electronic device, defines a second gap, and has a second width less than the first width. The first reflowable material is disposed in the first gap and extends into the first recess portion. The second reflowable material is disposed in the second gap. A length of the first reflowable material is greater than a length of the second reflowable material.

In some embodiments, an electronic manufacturing method includes: (a) providing an electronic device including a first bump and a second bump on a same side of the electronic device, wherein the second bump has a width less than a width of the first bump, and the first bump defines a first accommodation space; and (b) forming a first reflowable material on the first bump and in the first accommodation space, and forming a second reflowable material on the second bump, wherein the first accommodation space is configured to reduce the difference between a first elevation of the first reflowable material and a second elevation of the second reflowable material after a reflowing process.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
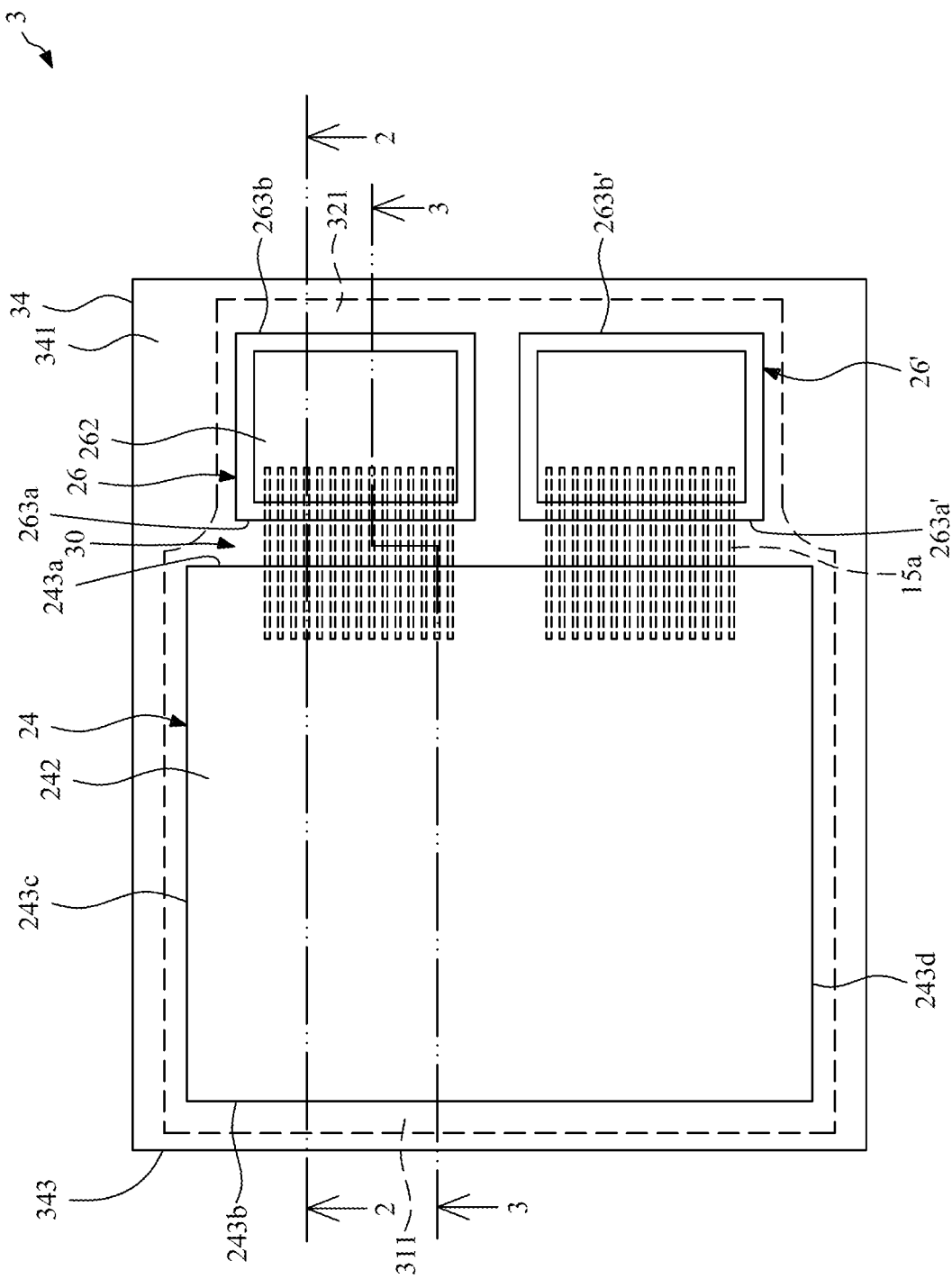
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
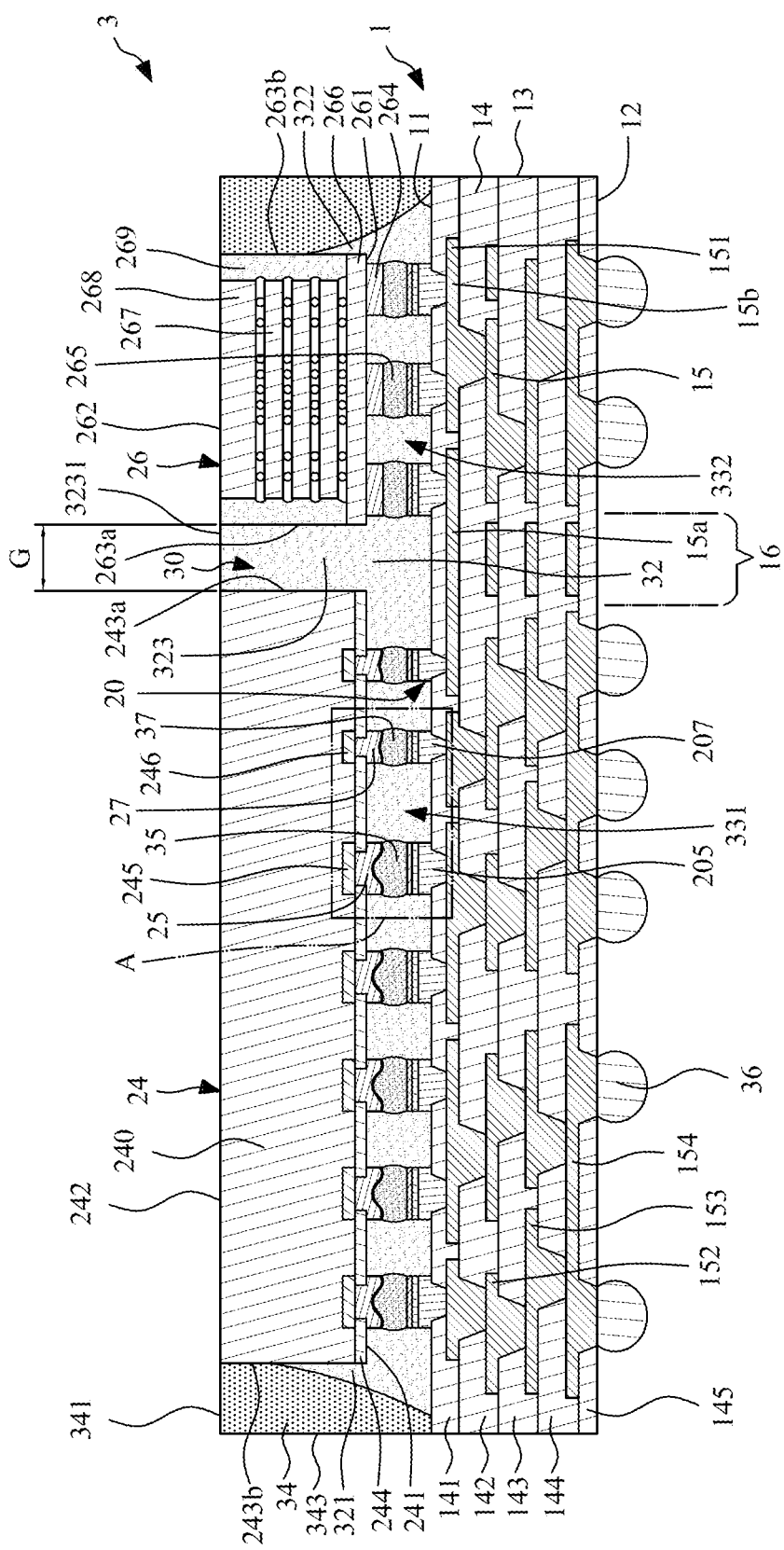
FIG. 2 illustrates a cross-sectional view taken along line 2-2 of the package structure of FIG. 1.
Figure 3:
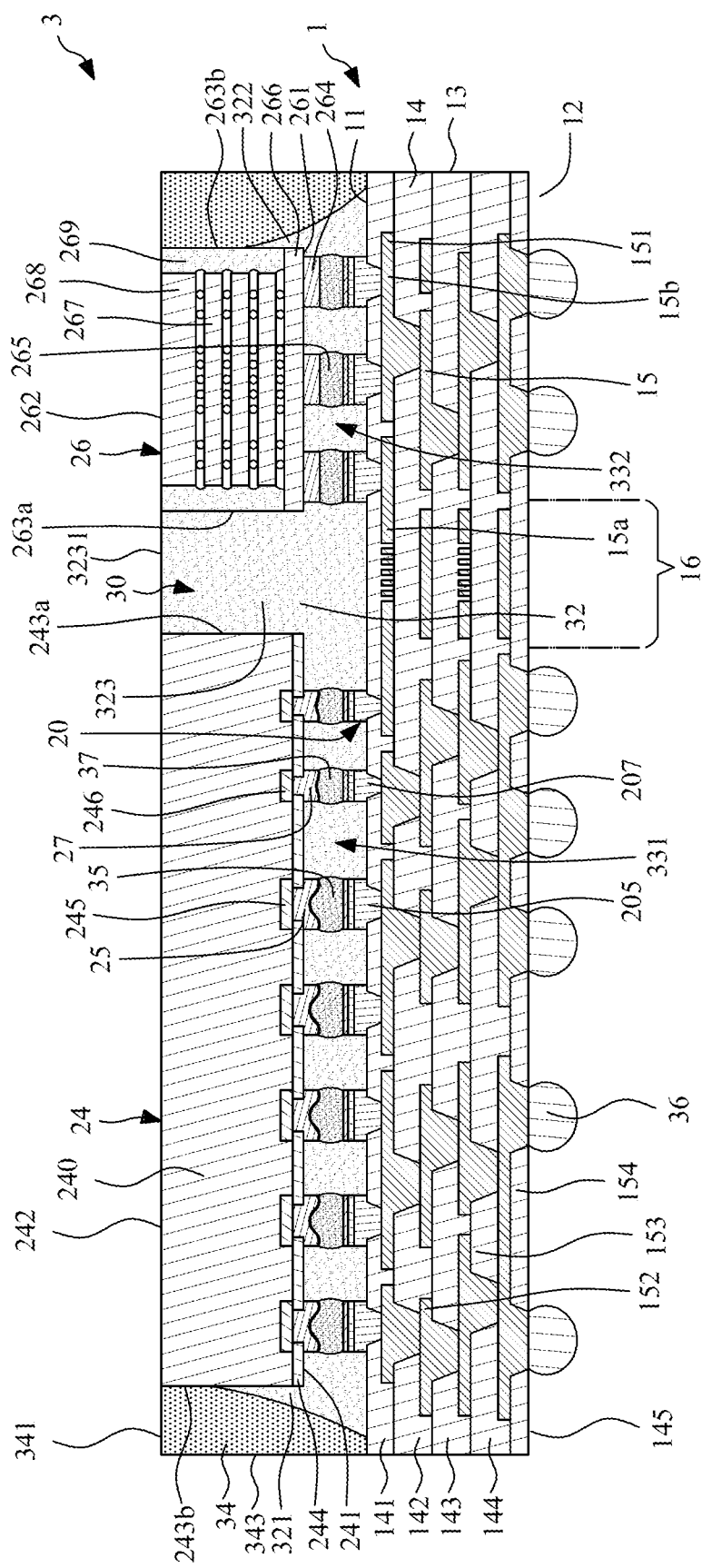
FIG. 3 illustrates a cross-sectional view taken along line 3-3 of the package structure of FIG. 1.
Figure 4:
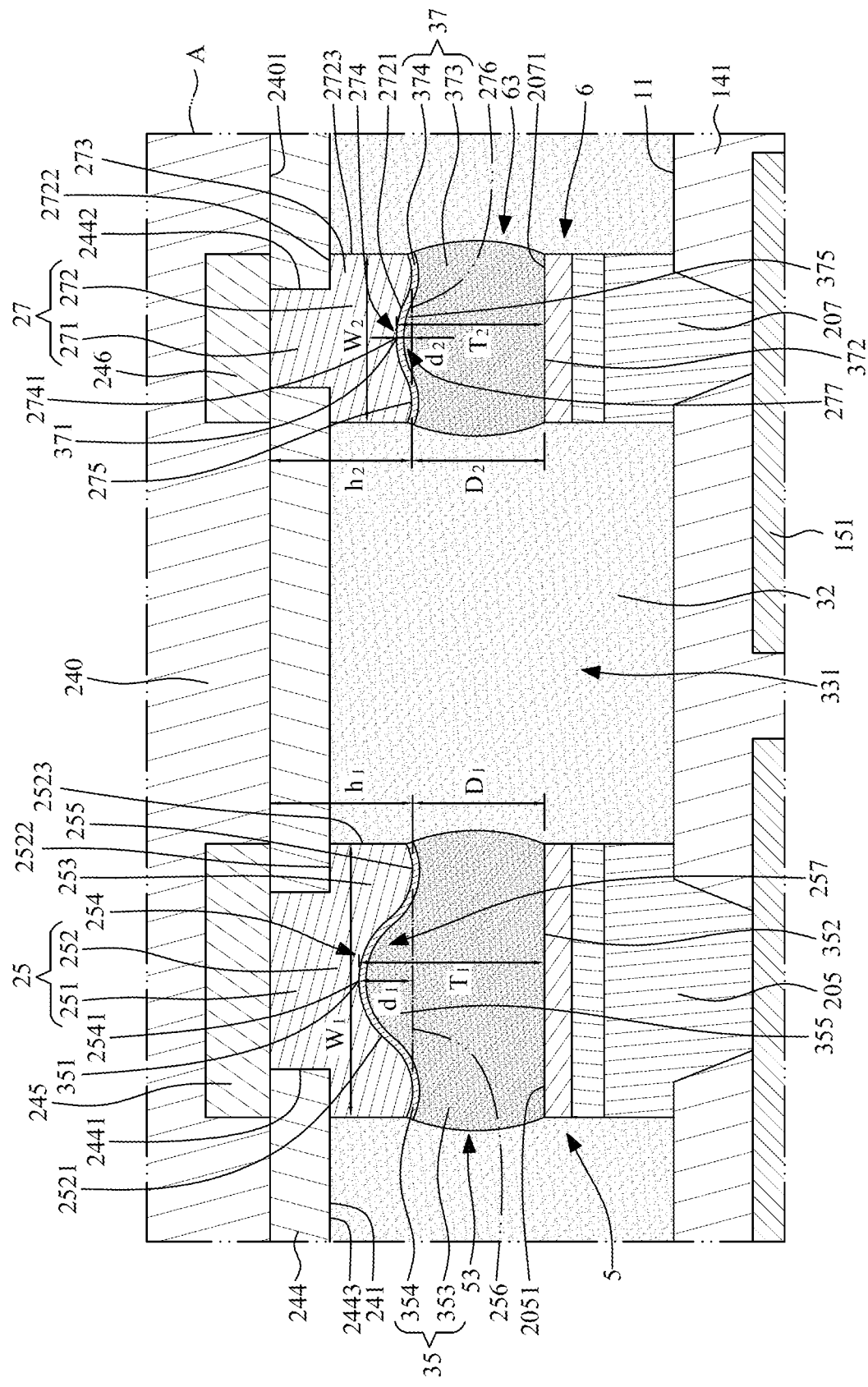
FIG. 4 illustrates an enlarged view of a region "A" in FIG. 2.

FIG. 1 illustrates a top view of a package structure 3 according to some embodiments of the present disclosure. FIG. 2 illustrates a cross-sectional view taken along line 2-2 of the package structure 3 of FIG. 1. FIG. 3 illustrates a cross-sectional view taken along line 3-3 of the package structure 3 of FIG. 1. FIG. 4 illustrates an enlarged view of a region "A" in FIG. 2. The package structure 3 includes a wiring structure 1, a first electronic device 24, two second electronic devices 26, 26', a protection material 32, an encapsulant 34 and a plurality of solder materials 36. As shown in FIG. 1, the package structure 3 may include one first electronic device 24 and two second electronic devices 26, 26'. However, the amounts of the first electronic device(s) 24 and the second electronic device(s) 26, 26' are not limited in the present disclosure.

As shown in FIG. 2 and FIG. 3, the wiring structure 1 has a first surface 11, a second surface 12 opposite to the first surface 11, a lateral side surface 13 extending between the first surface 11 and the second surface 12, and a high line density region 16 (or a fine line region) between the first electronic device 24 and the second electronic devices 26, 26'. The wiring structure 1 may include at least one dielectric layer 14, at least one circuit layer 15 in contact with the dielectric layer 14, and a plurality of electrical contacts 20 (including at least one first electrical contact 205 and at least one second electrical contact 207). For example, as shown in FIG. 2 and FIG. 3, the wiring structure 1 includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154.

The first dielectric layer 141 may be a topmost dielectric layer or an outermost dielectric layer of the wiring structure 1. The first circuit layer 151 may be a topmost circuit layer or an outermost circuit layer of the wiring structure 1. A material of the first circuit layer 151 may include, for example, copper, another conductive metal, or an alloy thereof. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first circuit layer 151 is disposed adjacent to the top surface of the first dielectric layer 141. In some embodiments, the first circuit layer 151 is embedded in the first dielectric layer 141, and is exposed from the top surface of the first dielectric layer 141. That is, the first dielectric layer 141 covers the first circuit layer 151, and defines a plurality of openings to expose portions of the first circuit layer 151.

Further, the first circuit layer 151 may include an interconnection portion 15a and a periphery portion 15b. The interconnection portion 15a is located in the high line density region 16, and the periphery portion 15b is located outside the high line density region 16 (e.g., a low line density region). For example, the second electronic devices 26, 26' may be electrically connected to the first electronic device 24 through the interconnection portion 15a of the first circuit layer 151. The second electronic devices 26, 26' and the first electronic device 24 may be electrically connected to the solder materials 36 on the second surface 12 of the wiring structure 1 through the periphery portion 15b of the first circuit layer 151. A line width/line space (L/S) of the traces of the interconnection portion 15a may be less than an L/S of the traces of the periphery portion 15b. For example, an L/S of the traces of the interconnection portion 15a may be less than or equal to about 5 µm/about 5 µm, or less than or equal to about 2 µm/about 2 µm, or less than or equal to about 0.8 µm/about 0.8 µm. An L/S of the traces of the periphery portion 15b may be less than or equal to about 10 µm/about 10 am, or less than or equal to about 7 m/about 7 µm, or less than or equal to about 5 µm/about 5 µm.

The first dielectric layer 141 and the first circuit layer 151 may be disposed on the second dielectric layer 142. In addition, the second dielectric layer 142 may cover the second circuit layer 152. A portion (i.e., a via portion) of the first circuit layer 151 extends through the second dielectric layer 142 to electrically connect the second circuit layer 152. A material of the second dielectric layer 142 may be the same as or similar to the material of the first dielectric layer 141. The second circuit layer 152 may also include an interconnection portion located in the high line density region 16, and a periphery portion located outside the high line density region 16. In some embodiments, the via portion of the first circuit layer 151 may extend from the periphery portion, and they may be formed concurrently and integrally.

Similarly, the second dielectric layer 142 and the second circuit layer 152 may be disposed on the third dielectric layer 143. In addition, the third dielectric layer 143 may cover the third circuit layer 153. A portion (i.e., a via portion) of the second circuit layer 152 extends through the third dielectric layer 143 to electrically connect the third circuit layer 153. A material of the third dielectric layer 143 may be the same as or similar to the material of the second dielectric layer 142. The third circuit layer 153 may also include an interconnection portion located in the high line density region 16, and a periphery portion located outside the high line density region 16. In some embodiments, the via portion of the second circuit layer 152 may extend from the periphery portion, and they may be formed concurrently and integrally.

Similarly, the third dielectric layer 143 and the third circuit layer 153 may be disposed on the fourth dielectric layer 144. In addition, the fourth dielectric layer 144 may cover the fourth circuit layer 154. A portion (i.e., a via portion) of the third circuit layer 153 extends through the fourth dielectric layer 144 to electrically connect the fourth circuit layer 154. A material of the fourth dielectric layer 144 may be the same as or similar to the material of the third dielectric layer 143. The fourth circuit layer 154 may also include an interconnection portion located in the high line density region 16, and a periphery portion located outside the high line density region 16.

The fourth dielectric layer 144 and the fourth circuit layer 154 may be disposed on the fifth dielectric layer 145. A portion (i.e., a via portion) of the fourth circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. As shown in FIG. 2 and FIG. 3, the second electronic devices 26, 26' may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154). The second electronic devices 26, 26' and the first electronic device 24 may be electrically connected to the solder materials 36 through the via portions of the periphery portion 15b of the circuit layer 15 (including, for example, the periphery portions 15b of the first circuit layer 151, the second circuit layer 152, the third circuit layer 153 and the fourth circuit layer 154).

The electrical contacts 20 (including, for example, at least one first electrical contact 205 and at least one second electrical contact 207) may be protrusion pads that are disposed on and protrude from the first dielectric layer 141 (i.e., the topmost dielectric layer or the outermost dielectric layer) of the wiring structure 1. The electrical contacts 20 may be disposed on and protrude from the first surface 11 of the wiring structure 1, and extend through the first dielectric layer 141 (i.e., the topmost dielectric layer or the outermost dielectric layer) to electrically connect the first circuit layer 151. In some embodiments, a width of the first electrical contact 205 may be greater than a width of the second electrical contact 207. In some embodiments, each of the electrical contacts 20 may include at least one surface finish layer on its top end. Thus, the electrical contact 205 may include at least one surface finish layer on its top end, and the second electrical contact 207 may include at least one surface finish layer on its top end.

The first electronic device 24 and the second electronic devices 26, 26' are disposed adjacent to or disposed on the first surface 11 of the wiring structure 1 side by side, and are electrically connected to the circuit layer 15 of the wiring structure 1. The first electronic device 24 may be a semiconductor device such as an application specific integrated circuit (ASIC) die. As shown in FIG. 1 to FIG. 3, the first electronic device 24 has a first active surface 241 (e.g., bottom surface), a first backside surface 242 (e.g., top surface), a first lateral side surface 243a and a second lateral side surface 243b. The first backside surface 242 is opposite to the first active surface 241. The first lateral side surface 243a and the second lateral side surface 243b extend between the first active surface 241 and the first backside surface 242. The first lateral side surface 243a faces to the second electronic device 26. The second lateral side surface 243b is opposite to the first lateral side surface 243a.

Further, the first electronic device 24 may include a substrate 240, a plurality of conductive pads (including, for example, at least one first conductive pad 245 and at least one second conductive pad 246), a passivation layer 244, a plurality of bumps (including, for example, at least one first bump 25 and at least one second bump 27) and a plurality of reflowable materials (including, for example, at least one first reflowable material 35 and at least one second reflowable material 37). The substrate 240 may include a silicon material. The first conductive pad 245 and the second conductive pad 246 may be disposed adjacent to and exposed from a surface 2401 of the substrate 240. The passivation layer 244 may be disposed on the surface 2401 of the substrate 240, and may define at least one first opening 2441 to expose the first conductive pad 245 and at least one second opening 2442 to expose the second conductive pad 246. The passivation layer 244 has a surface 2443 which may be the first active surface 241 of the first electronic device 24. In addition, the first bump 25 may be disposed over the substrate 240, and may have a first width $W_1$. A portion of the first bump 25 may be disposed in the first opening 2441 and on the substrate 240 to electrically connect or physically contact the first conductive pad 245. The second bump 27 may be disposed over the substrate 240, and may have a second width $W_2$ less than the first width $W_1$. A portion of the second bump 27 may be disposed in the second opening 2442 and on the substrate 240 to electrically connect or physically contact the second conductive pad 246. The first bump 25 and the second bump 27 are disposed on a same side of the first electronic device 24.

In some embodiments, the bumps (including, for example, at least one first bump 25 and at least one second bump 27) of the first electronic device 24 may be electrically connected and physically connected to the electrical contacts 20 (including at least one first electrical contact 205 and at least one second electrical contact 207) through the reflowable material (including, for example, at least one first reflowable material 35 and at least one second reflowable material 37). For example, the first reflowable material 35 and the second reflowable material 37 may be solder materials. Thus, the first electronic device 24 may be electrically connected to the wiring structure 1 by flip-chip bonding. In addition, an outer surface 2051 (e.g., a top surface) of the first electrical contact 205 may be a substantially flat surface, and an outer surface 2071 (e.g., a top surface) of the second electrical contact 207 may be a substantially flat surface.

The second electronic device 26 may be a semiconductor device such as high bandwidth memory (HBM) die. The second electronic device 26 has a second active surface 261 (e.g., bottom surface), a second backside surface 262 (e.g., top surface), a first lateral side surface 263a and a second lateral side surface 263b. The second backside surface 262 is opposite to the second active surface 261. The first lateral side surface 263a and the second lateral side surface 263b extend between the second active surface 261 and the second backside surface 262.

Further, the second electronic device 26 may include a plurality of bumps 264 disposed adjacent to the second active surface 261. The bumps 264 may be exposed or may protrude from the second active surface 261 for electrical connection. In some embodiments, the bumps 264 of the second electronic device 26 may be electrically connected and bonded to the electrical contacts 20 through a plurality of solders 265 (e.g., solder materials). In other words, the second electronic device 26 may be bonded to the wiring structure 1 by flip-chip bonding. As shown in FIG. 2 and FIG. 3, the second electronic device 26 may include a logic die 266, a plurality of memory dice 267, a top die 268 and a package body 269 (e.g., a molding compound). The top die 268 and the memory dice 267 may be stacked on a top surface of the logic die 266. The package body 269 may cover the top die 268, the memory dice 267 and a portion of the top surface of the logic die 266.

As shown in FIG. 2 and FIG. 3, a gap 30 is formed between the first lateral side surface 243a of the first electronic device 24 and the first lateral side surface 263a of the second electronic device 26. That is, the first lateral side surface 243a of the first electronic device 24 faces the first lateral side surface 263a of the second electronic device 26 to define the gap 30. The width G of the gap 30 may be greater than or equal to about 150 μm, greater than or equal to about 200 μm, or greater than or equal to about 300 μm. In some embodiments, the width G of the gap 30 may be less than 150 μm, or less than or equal to about 100 μm.

As shown in FIG. 2 and FIG. 3, the protection material 32 (i.e., an underfill) may be disposed in a first space 331 between the first electronic device 24 and the wiring structure 1 so as to cover and protect the joints formed by the bumps (including, for example, at least one first bump 25 and at least one second bump 27), the reflowable material (including, for example, at least one first reflowable material 35 and at least one second reflowable material 37) and the electrical contacts 20 (including at least one first electrical contact 205 and at least one second electrical contact 207). Further, the protection material 32 may be disposed in a second space 332 between the second electronic device 26 and the wiring structure 1 so as to cover and protect the joints formed by the bumps 264, the solders 265 and the electrical contacts 20. In addition, the protection material 32 may include a first portion 321, a second portion 322 and a third portion 323. The third portion 323 of the protection material 32 may further extend into the gap 30 to substantially fill the gap 30. Alternatively, the third portion 323 of the protection material 32 may completely fill the gap 30, and may have a top surface 3231 substantially coplanar with the first backside surface 242 of the first electronic device 24 and the second backside surface 262 of the second electronic device 26. In some embodiments, the first portion 321 of the protection material 32 may extend to or may be disposed on the second lateral side surface 243b of the first electronic device 24, and the second portion 322 of the protection material 32 may extend to or may be disposed on the second lateral side surface 263b of the second electronic device 26.

The encapsulant 34 may cover at least a portion of the first electronic device 24, at least a portion of the second electronic device 26 and the protection material 32. The encapsulant 34 may cover at least a portion of the second lateral side surface 243b of the first electronic device 24 and at least a portion of the second lateral side surface 263b of the second electronic device 26. A material of the encapsulant 34 may be a molding compound with or without fillers. The encapsulant 34 has a first surface 341 (e.g., a top surface) and a lateral side surface 343. As shown in FIG. 2 and FIG. 3, the first surface 341 of the encapsulant 34, the first backside surface 242 of the first electronic device 24, the second backside surface 262 of the second electronic device 26 and the top surface 3231 of the third portion 323 of the protection material 32 may be substantially coplanar with each other. In addition, the lateral side surface 343 of the encapsulant 34 may be substantially coplanar with the lateral side surface 13 of the wiring structure 1.

The solder materials 36 (e.g., solder balls) may be disposed adjacent to the second surface 12 of the wiring structure 1 for external connection. As shown in FIG. 2 and FIG. 3, the solder materials 36 are disposed on the exposed portions (i.e., the bottom portions of the via portions) of the fourth circuit layer 154.

Referring to FIG. 4, a width of the first conductive pad 245 may be greater than a width of the second conductive pad 246, a width of the first opening 2441 may be greater than a width of the second opening 2442, the first width $W_1$ of the first bump 25 may be greater than the second width $W_2$ of the second bump 27, a width of the first reflowable material 35 may be greater than a width of the second reflowable material 37, and a width of the first electrical contact 205 may be greater than a width of second electrical contact 207. It is noted that above-mentioned difference of widths is not caused by manufacturing tolerance. For example, the width of the first bump 25 may be greater than 1.1 times, 1.5 times, 2 times, or 2.5 times the width of the second bump 27.

In some embodiments, the first bump 25 may be physically connected to and/or electrically connected to the first electrical contact 205 through the first reflowable material 35. The first bump 25 may include a base portion 251 and an end portion 252 formed integrally. The base portion 251 may be disposed in the first opening 2441 of the passivation layer 244. The end portion 252 may extend to the surface 2443 of the passivation layer 244 or the first active surface 241 of the first electronic device 24. The end portion 252 of the first bump 25 may define a first recess portion 254 recessed from the end portion 252 to form a first accommodating space 257 for accommodating a portion of the first reflowable material 35. The first recess portion 254 may be located at a center of an outer surface 2521 (e.g., a bottom surface) of the end portion 252.

The end portion 252 of the first bump 25 may include a periphery portion 253 and an outermost end portion 255. The periphery portion 253 may be disposed on the surface 2443 of the passivation layer 244 or the first active surface 241 of the first electronic device 24. In some embodiments, the periphery portion 253 may have a uniform thickness and a uniform width. However, in other embodiments, the periphery portion 253 may have a non-uniform thickness and a non-uniform width. The outermost end portion 255 is a most protruded portion of the end portion 252. The periphery portion 253 and the outermost end portion 255 may be around or surround the first recess portion 254. A height (e.g., a maximum height $h_1$) of the first bump 25 is defined as a vertical distance between the surface 2401 of the substrate 240 and the outermost end portion 255 of the first bump 25. A first distance $D_1$ is defined as a vertical distance between the outermost end portion 255 of the first bump 25 and the outer surface 2051 (e.g., a top surface) of the first electrical contact 205.

An imaginary horizontal plane 256 may be defined by the outermost end portion 255 of the first bump 25. A depth (e.g., a maximum depth $d_1$) of the first recess portion 254 may be measured from the imaginary horizontal plane 256. The maximum depth d1 of the first recess portion 254 is a distance between the first imaginary horizontal plane 256 and a bottom 2541 (e.g., a deepest point) of the first recess portion 254. The first accommodating space 257 may be defined by the imaginary horizontal plane 256 and the first recess portion 254. As shown in FIG. 4, the outer surface 2521 (e.g., a bottom surface) of the end portion 252 of the first bump 25 may be a curved surface or a wavy surface. Thus, a cross section of the end portion 252 of the first bump 25 may have or comprise a wavy outer surface 2521.

The first reflowable material 35 may extend beyond the imaginary horizontal plane 256, and may have a top end 351 in the first recess portion 254 and a bottom end 352 on the first electrical contact 205. A maximum thickness (or a length) $T_1$ of the first reflowable material 35 may be a vertical distance between the top end 351 and the bottom end 352. The maximum thickness $T_1$ may be equal to a sum of the first distance $D_1$ and the maximum depth $d_1$. The first reflowable material 35 may be non-symmetrical with respect to a central horizontal plane of the first reflowable material 35. Further, the first reflowable material 35 may include a first main portion 353 and a first intermetallic compound (IMC) 354 interposed between the first main portion 353 and the first bump 25. The first intermetallic compound (IMC) 354 may be in a hat shape or cap shape. The first main portion 353 may include a first extending portion 355 extending into the first recess portion 254. The first extending portion 355 may contact to or extend from the first main portion 353. Thus, the first reflowable material 35 may be disposed on the first bump 25 and in the first recess portion 254.

In some embodiments, the second bump 27 may be physically connected to and/or electrically connected to the second electrical contact 207 through the second reflowable material 37. The second bump 27 may include a base portion 271 and an end portion 272 formed integrally. The base portion 271 may be disposed in the second opening 2442 of the passivation layer 244. The end portion 272 may extend to the surface 2443 of the passivation layer 244 or the first active surface 241 of the first electronic device 24. The end portion 272 of the second bump 27 may define a second recess portion 274 recessed from the end portion 272 to form a second accommodating space 277 for accommodating a portion of the second reflowable material 37. The second recess portion 274 may be located at a center of an outer surface 2721 (e.g., a bottom surface) of the end portion 272.

The end portion 272 of the second bump 27 may include a periphery portion 273 and an outermost end portion 275. The periphery portion 273 may be disposed on the surface 2443 of the passivation layer 244 or the first active surface 241 of the first electronic device 24. In some embodiments, the periphery portion 273 may have a uniform thickness and a uniform width. However, in other embodiments, the periphery portion 273 may have a non-uniform thickness and a non-uniform width. The outermost end portion 275 is a most protruded portion of the end portion 272. The periphery portion 273 and the outermost end portion 275 may surround the second recess portion 274. A height (e.g., a maximum height $h_2$) of the second bump 27 is defined as a vertical distance between the surface 2401 of the substrate 240 and the outermost end portion 275 of the second bump 27. A second distance $D_2$ is defined as a vertical distance between the outermost end portion 275 of the second bump 27 and the outer surface 2071 of the second electrical contact 207. In some embodiments, the height (e.g., the maximum height $h_2$) of the second bump 27 may be substantially equal to the height (e.g., the maximum height $h_1$) of the first bump 25, and the second distance $D_2$ may be substantially equal to the first distance $D_1$.

An imaginary horizontal plane 276 may be defined by the outermost end portion 275 of the second bump 27. The first imaginary horizontal plane 256 may be substantially coplanar with the second imaginary horizontal plane 276. A depth (e.g., a maximum depth $d_2$) of the second recess portion 274 may be measured from the imaginary horizontal plane 276. The maximum depth $d_2$ of the second recess portion 274 is a distance between the second imaginary horizontal plane 276 and a bottom 2741 (e.g., a deepest point) of the second recess portion 274. The second accommodating space 277 may be defined by the imaginary horizontal plane 276 and the second recess portion 274. As shown in FIG. 4, the outer surface 2721 (e.g., a bottom surface) of the end portion 272 of the second bump 27 may be a curved surface or a wavy surface. Thus, a cross section of the end portion 272 of the second bump 27 may have a wavy outer surface 2721. In some embodiments, the depth (e.g., the maximum depth $d_1$) of the first recess portion 254 may be greater than the depth (e.g., the maximum depth $d_2$) of the second recess portion 274, and a volume capacity of the first accommodating space 257 may be greater than a volume capacity of the second accommodating space 277. For example, the maximum depth $d_1$ of the first recess portion 254 may be greater than 1.1 times, 1.5 times, 2 times, 3 times, 4 times the maximum depth $d_2$ of the second recess portion 274. The difference between the maximum depth $d_1$ of the first recess portion 254 and the maximum depth $d_2$ of the second recess portion 274 is not caused by the manufacturing tolerance. In some embodiments, an elevation of the bottom 2541 of the first recess portion 254 is different from an elevation of the bottom 2741 of the second recess portion 274. For example, the elevation of the bottom 2541 of the first recess portion 254 with respect to the surface 2401 of the substrate 240 or the surface 2443 of the passivation layer 244 may be less than the elevation of the bottom 2741 of the second recess portion 274 with respect to the surface 2401 of the substrate 240 or the surface 2443 of the passivation layer 244.

The second reflowable material 37 may extend beyond the imaginary horizontal plane 276, and may have a top end 371 in the second recess portion 274 and a bottom end 372 on the second electrical contact 207. An elevation of the top end 351 of the first reflowable material 35 is higher than an elevation of the top end 371 of the second reflowable material 37. A maximum thickness (or a length) $T_2$ of the second reflowable material 37 may be a vertical distance between the top end 371 and the bottom end 372. The maximum thickness $T_2$ may be equal to a sum of the second distance $D_2$ and the maximum depth $d_2$. The second reflowable material 37 may be non-symmetrical with respect to a central horizontal plane of the second reflowable material 37. Further, the second reflowable material 37 may include a second main portion 373 and a second intermetallic compound (IMC) 374 interposed between the second main portion 373 and the second bump 27. The second intermetallic compound (IMC) 374 may be in a hat shape or cap shape. At least a portion of the first intermetallic compound (IMC) 354 and at least a portion of the second intermetallic compound (IMC) 374 are at different elevations. The second main portion 373 of the second reflowable material 37 may include a second extending portion 375 extending into the second recess portion 274. The second extending portion 375 may contact to or extend from the second main portion 373. Thus, the second reflowable material 37 may be disposed on the second bump 27 and in the second recess portion 274.

In some embodiments, the maximum thickness $T_1$ of the first reflowable material 35 is substantially greater than the maximum thickness $T_2$ of the second reflowable material 37. For example, the maximum thickness $T_1$ of the first reflowable material 35 may be greater than 1.1 times, 1.2 times, 1.3 times, 1.4 times, or 1.5 times the maximum thickness $T_2$ of the second reflowable material 37. The difference between the maximum thickness $T_1$ of the first reflowable material 35 and the maximum thickness $T_2$ of the second reflowable material 37 is not caused by the manufacturing tolerance.

In some embodiments, the end portion 252 of the first bump 25 has an inner surface 2522 contacting the surface 2443 of a passivation layer 244 and a lateral side surface 2523. The end portion 272 of the second bump 27 has an inner surface 2722 contacting the surface 2443 of the passivation layer 244 and a lateral side surface 2723. The inner surface 2722 of the end portion 272 of the second bump 27 is substantially coplanar with the inner surface 2522 of the end portion 252 of the first bump 25.

In some embodiments, the first electronic device 24 may be electrically connected to the wiring structure 1 through a first interconnection structure 5, the first reflowable material 35, a second interconnection structure 6 and the second reflowable material 37. The first interconnection structure 5 may be disposed between the wiring structure 1 and the first electronic device 24, and defines a first gap 53 and the first recess portion 254 communicating with the first gap 53. The first interconnection structure 5 may have a first width $W_1$. The second interconnection structure 6 may be disposed between the wiring structure 1 and the first electronic device 24, and defines a second gap 63 and the second recess portion 274 communicating with the second gap 63. The second interconnection structure 6 may have a second width $W_2$ less than the first width $W_1$. The first reflowable material 35 is disposed in the first gap 53 of the first interconnection structure 5, and the first extending portion 355 of the first reflowable material 35 extends into the first recess portion 254. The second reflowable material 37 is disposed in the second gap 63 of the second interconnection structure 6, and the second extending portion 375 of the second reflowable material 37 extends into the second recess portion 274. A thickness (e.g., a maximum thickness) of the first extending portion 355 of the first reflowable material 35 (which is equal to the depth (e.g., a maximum depth $d_1$) of the first recess portion 254) is substantially greater than a thickness (e.g., a maximum thickness) of the second extending portion 375 (which is equal to the depth (e.g., a maximum depth $d_2$) of the second recess portion 274) of the second reflowable material 37. Further, a thickness of the first main portion 353 of the first reflowable material 35 may be substantially equal to a thickness of the second main portion 373 of the second reflowable material 37.

The first interconnection structure 5 may include the first electrical contact 205 disposed on the wiring structure 1 and the first bump 25 disposed on the first electronic device 24. The first gap 53 may be a gap or space between the first electrical contact 205 and the first bump 25. Thus, the first reflowable material 35 may be interposed between the first electrical contact 205 and the first bump 25. In addition, the second interconnection structure 6 may include a second electrical contact 207 disposed on the wiring structure 1 and a second bump 27 disposed on the first electronic device 24. The second gap 63 may be a gap or space between the second electrical contact 207 and the second bump 27. Thus, the second reflowable material 37 may be interposed between the second electrical contact 207 and the second bump 27.

In the embodiment illustrated in FIG. 1 to FIG. 4, the maximum depth $d_1$ of the first recess portion 254 may be greater than the maximum depth $d_2$ of the second recess portion 274 (or the volume capacity of the first accommodating space 257 may be greater than the volume capacity of the second accommodating space 277), thus, the first accommodating space 257 may accommodate a relatively large amount of the first reflowable material 35 in a plating process of the first reflowable material 35, so as to compensate or adjust the level difference between the first reflowable material 35 and the second reflowable material 37 after a reflow process before a bonding process. That is, the first accommodation space 257 may be configured to reduce the difference between a first elevation of the first reflowable material 35 and a second elevation of the second reflowable material 37 after a reflowing process. Then, during a flip chip bonding, all of the first reflowable materials 35 and the second reflowable materials 37 may contact the first electrical contacts 205 and the second electrical contacts 207, respectively. Thus, all of the first bumps 25 and the second the second bumps 27 may be securely bonded to the first electrical contacts 205 and the second electrical contacts 207, respectively. Thus, the quality of the bonding process is improved, and the yield rate of the package structure 3 is improved.

Figure 4A:
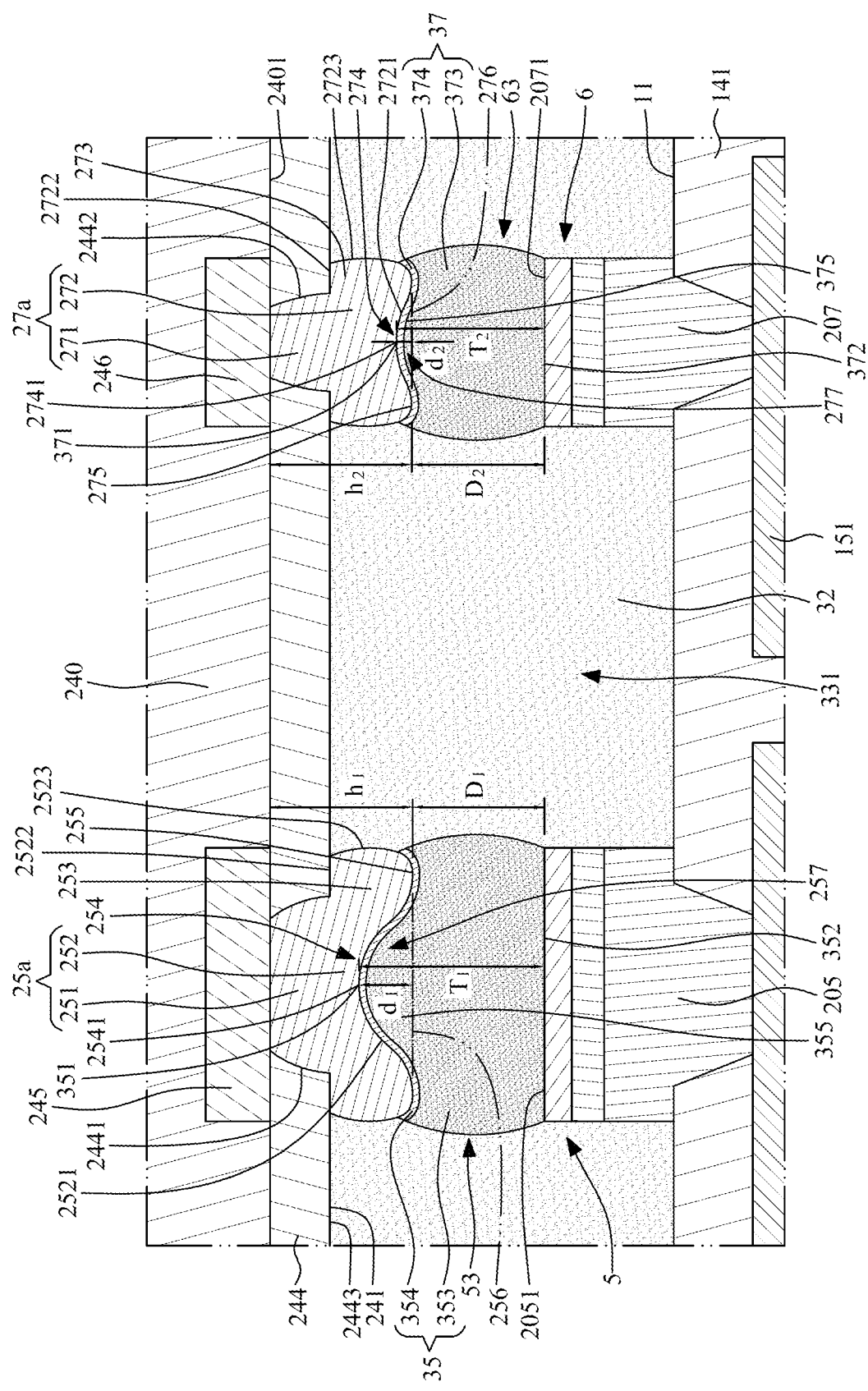
FIG. 4A illustrates an enlarged view of a region of a package structure according to some embodiments of the present disclosure.

FIG. 4A illustrates an enlarged view of a region of a package structure according to some embodiments of the present disclosure. The structure illustrated in FIG. 4A is similar to the structure illustrated in FIG. 4, except for the structures of the first bump 25a and the second bump 27a. As shown in FIG. 4A, the passivation layer 244 may define the first opening 2441 with a curved first sidewall, and define the second opening 2442 with a curved second sidewall. A radius of a curvature of the curved first sidewall is less than a radius of a curvature of the curved second sidewall. In addition, the lateral side surface 2523 of the end portion 252 of the first bump 25 is a curved from the cross-sectional view, and the lateral side surface 2723 of the end portion 272 of the second bump 27 is a curved from the cross-sectional view. Thus, there may be no obvious turning point between the lateral side surface 2523 and the outer surface 2521 of the end portion 252 of the first bump 25. Similarly, there may be no obvious turning point between the lateral side surface 2723 and the outer surface 2721 of the end portion 272 of the second bump 27.

Figure 4B:
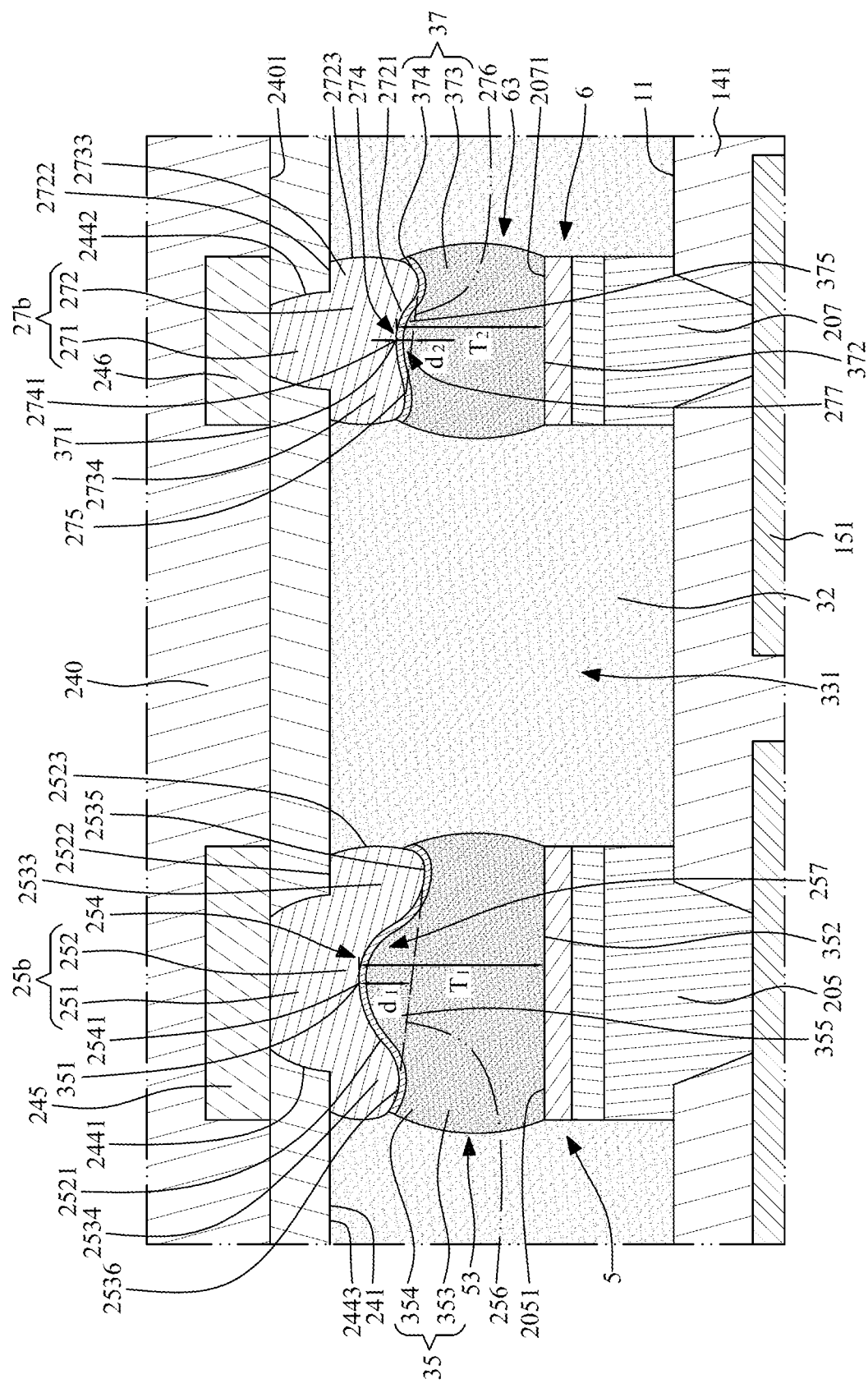
FIG. 4B illustrates an enlarged view of a region of a package structure according to some embodiments of the present disclosure.

FIG. 4B illustrates an enlarged view of a region of a package structure according to some embodiments of the present disclosure. The structure illustrated in FIG. 4B is similar to the structure illustrated in FIG. 4, except for the structures of the first bump 25b and the second bump 27b. As shown in FIG. 4B, the end portion 252 of the first bump 25b includes a first periphery portion 2533 and a second periphery portion 2534 opposite to or located adjacent to the first periphery portion 2533. A thickness of the first periphery portion 2533 may be different from a thickness of the second periphery portion 2534. Thus, an elevation of the first periphery portion 2533 may be different from an elevation of the second periphery portion 2534. For example, the thickness of the first periphery portion 2533 may be greater than the thickness of the second periphery portion 2534. Thus, the elevation of the apex 2536 of the second periphery portion 2534 with respect to the surface 2401 of the substrate 240 or the surface 2443 of the passivation layer 244 may be less than the elevation of the apex 2535 of the first periphery portion 2533 with respect to the surface 2401 of the substrate 240 or the surface 2443 of the passivation layer 244. In addition, the end portion 272 of the second bump 27b includes a first periphery portion 2733 and a second periphery portion 2734 opposite to the first periphery portion 2733. A thickness of the first periphery portion 2733 may be different from a thickness of the second periphery portion 2734.

Figure 4C:
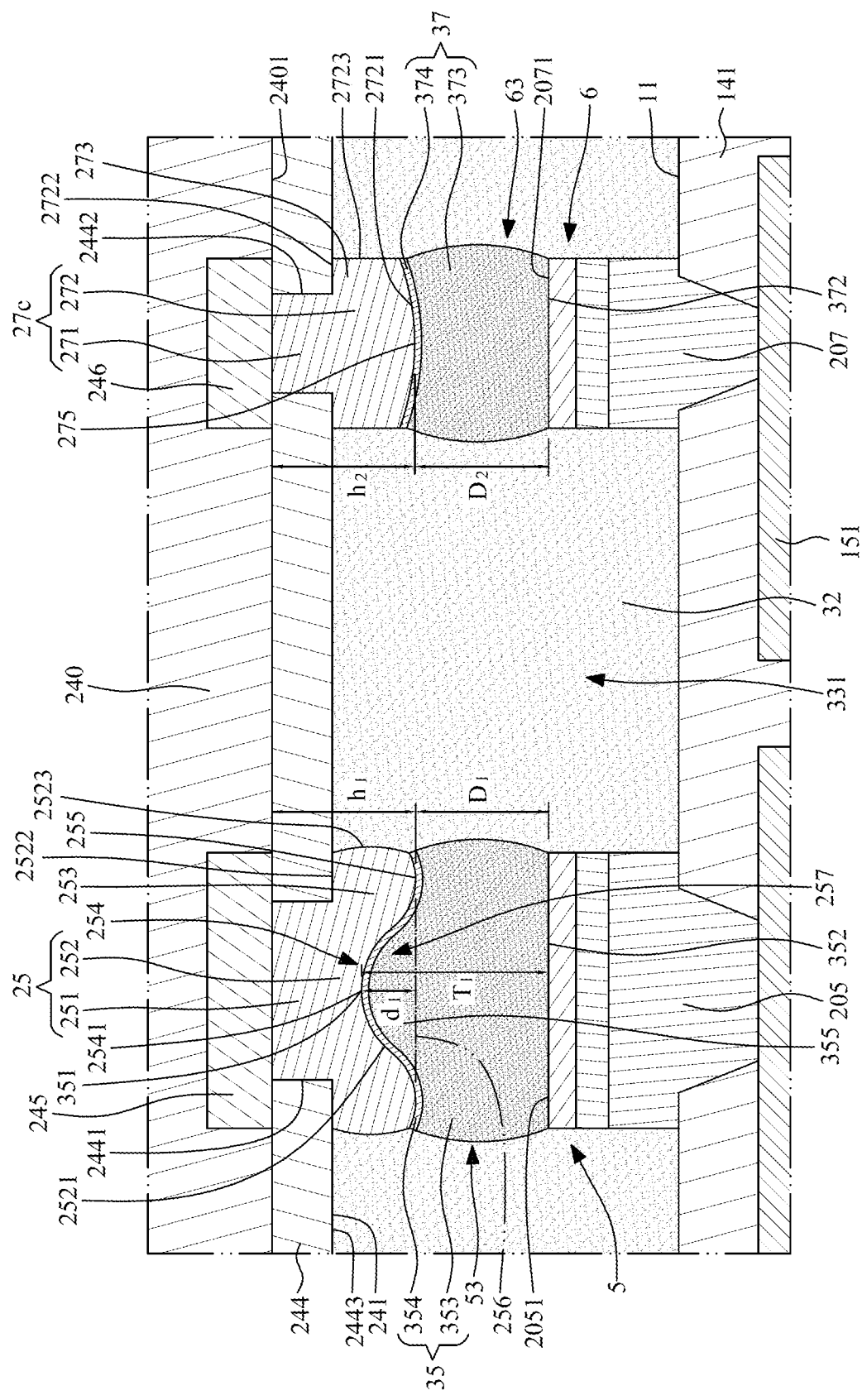
FIG. 4C illustrates an enlarged view of a region of a package structure according to some embodiments of the present disclosure.

FIG. 4C illustrates an enlarged view of a region of a package structure according to some embodiments of the present disclosure. The structure illustrated in FIG. 4C is similar to the structure illustrated in FIG. 4, except for a structure of the second bump 27c. As shown in FIG. 4C, the outer surface 2721 (e.g., a bottom surface) of the end portion 272 may be a downward convex surface.

Figure 4D:
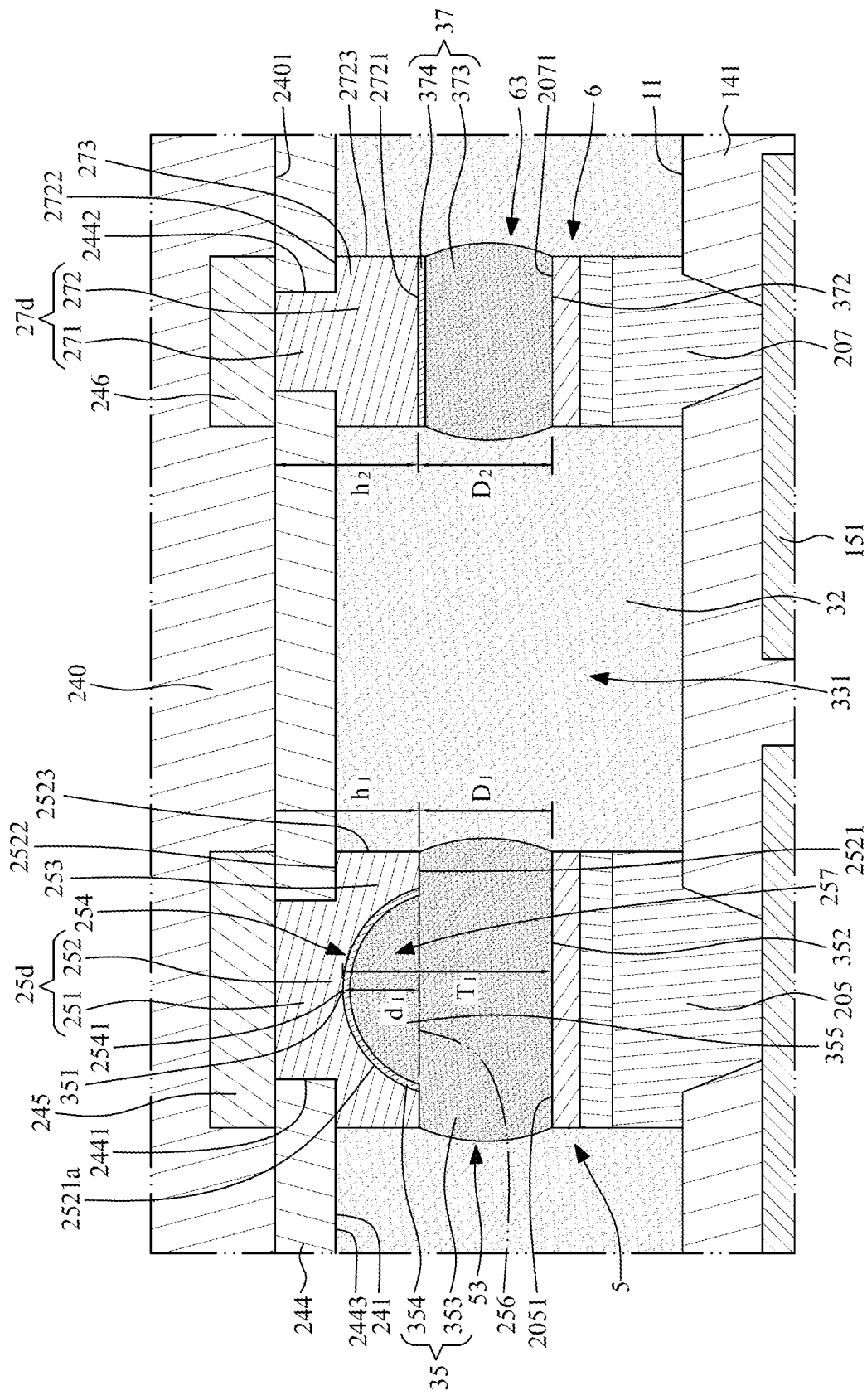
FIG. 4D illustrates an enlarged view of a region of a package structure according to some embodiments of the present disclosure.

FIG. 4D illustrates an enlarged view of a region of a package structure according to some embodiments of the present disclosure. The structure illustrated in FIG. 4D is similar to the structure illustrated in FIG. 4, except for the structures of the first bump 25d and the second bump 27d. As shown in FIG. 4D, a periphery portion of the outer surface 2521 of the end portion 252 of the first bump 25d may be a flat surface, and a center portion 2521a of the outer surface 2521 of the end portion 252 of the first bump 25d may be a substantially hemispherical surface. The center portion 2521a of the outer surface 2521 is the sidewall of the first recess portion 254. In addition, the outer surface 2721 (e.g., a bottom surface) of the end portion 272 of the second bump 27d may be a flat surface.

Figure 4E:
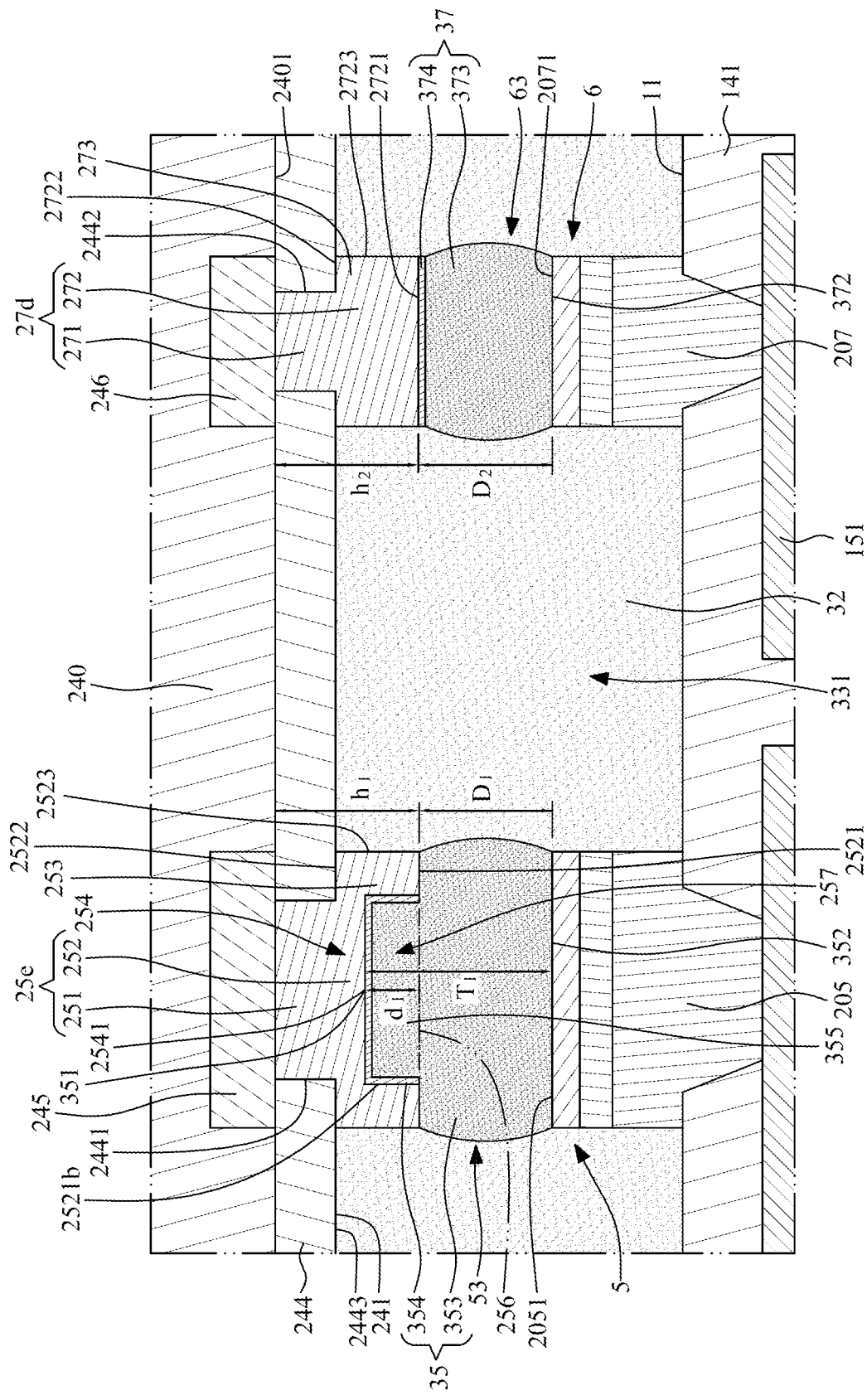
FIG. 4E illustrates an enlarged view of a region of a package structure according to some embodiments of the present disclosure.

FIG. 4E illustrates an enlarged view of a region of a package structure according to some embodiments of the present disclosure. The structure illustrated in FIG. 4E is similar to the structure illustrated in FIG. 4D, except for the structure of the first bump 25e. As shown in FIG. 4E, the center portion 2521b of the outer surface 2521 of the end portion 252 of the first bump 25e may be in a rectangular shape from the cross-sectional view.

Figure 4F:
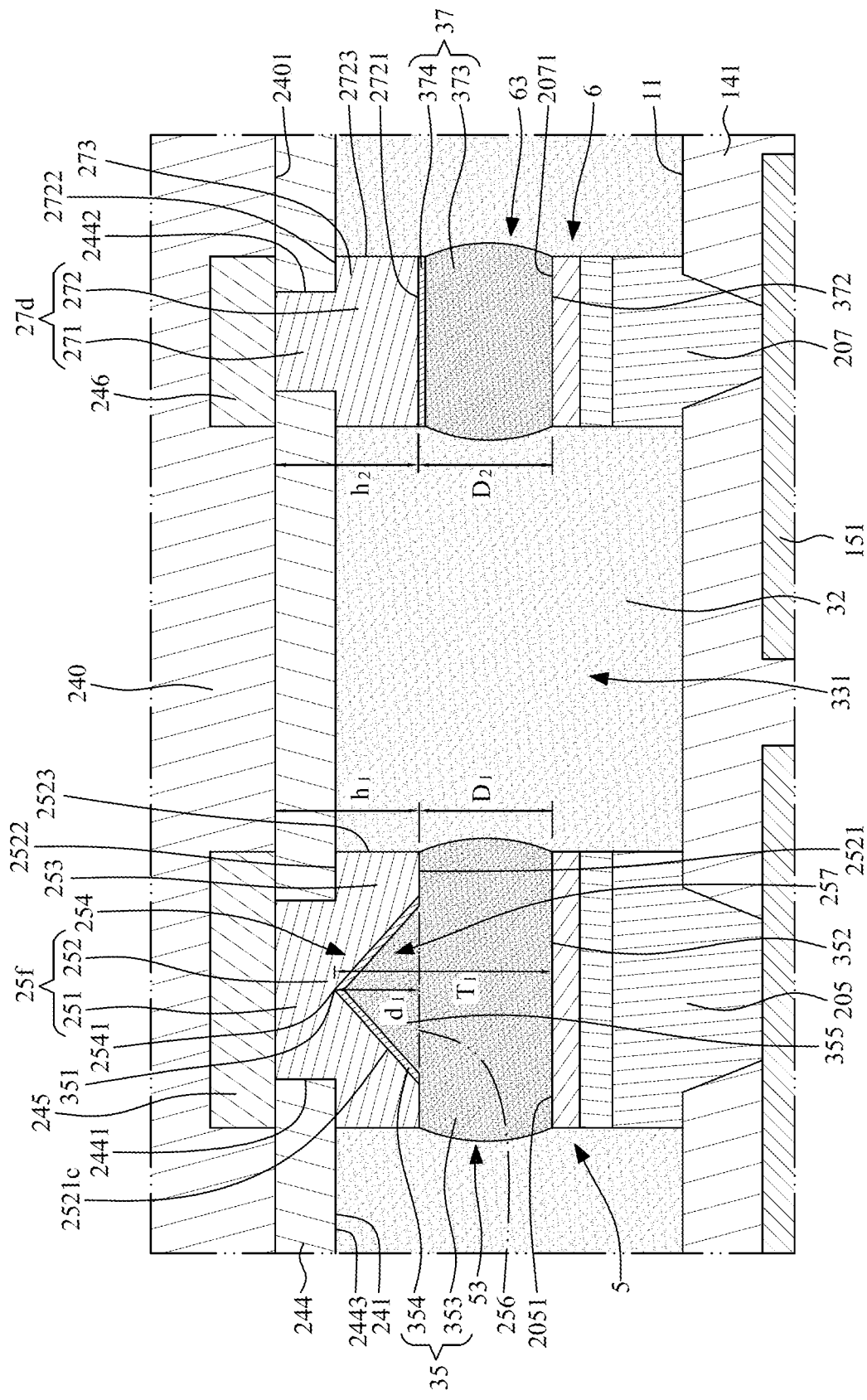
FIG. 4F illustrates an enlarged view of a region of a package structure according to some embodiments of the present disclosure.

FIG. 4F illustrates an enlarged view of a region of a package structure according to some embodiments of the present disclosure. The structure illustrated in FIG. 4F is similar to the structure illustrated in FIG. 4D, except for the structure of the first bump 25f. As shown in FIG. 4F, the center portion 2521c of the outer surface 2521 of the end portion 252 of the first bump 25e may be in a triangular shape from the cross-sectional view.

Figure 5:
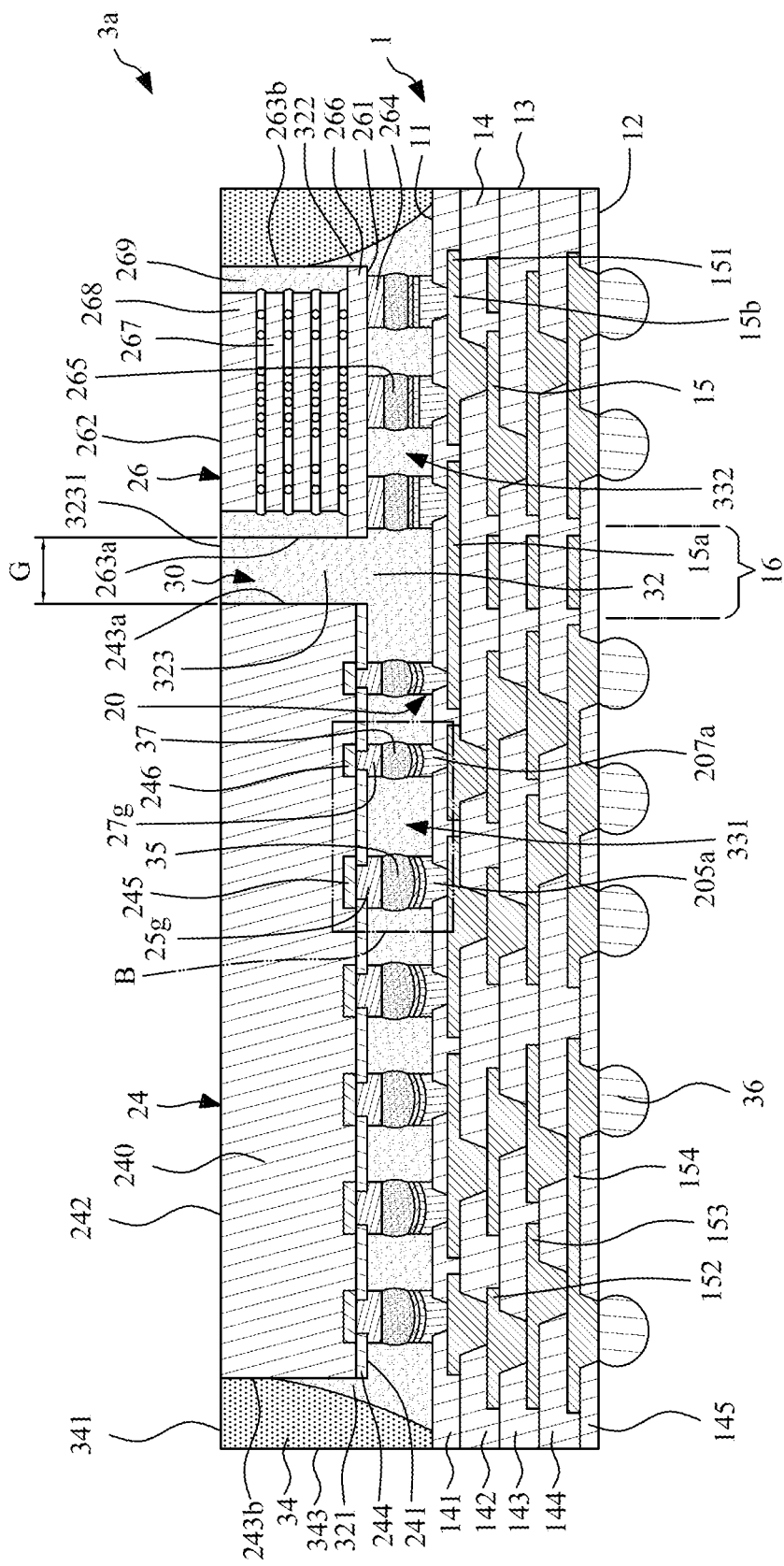
FIG. 5 illustrates a cross-sectional view of a package structure according to some embodiments of the present disclosure.
Figure 5A:
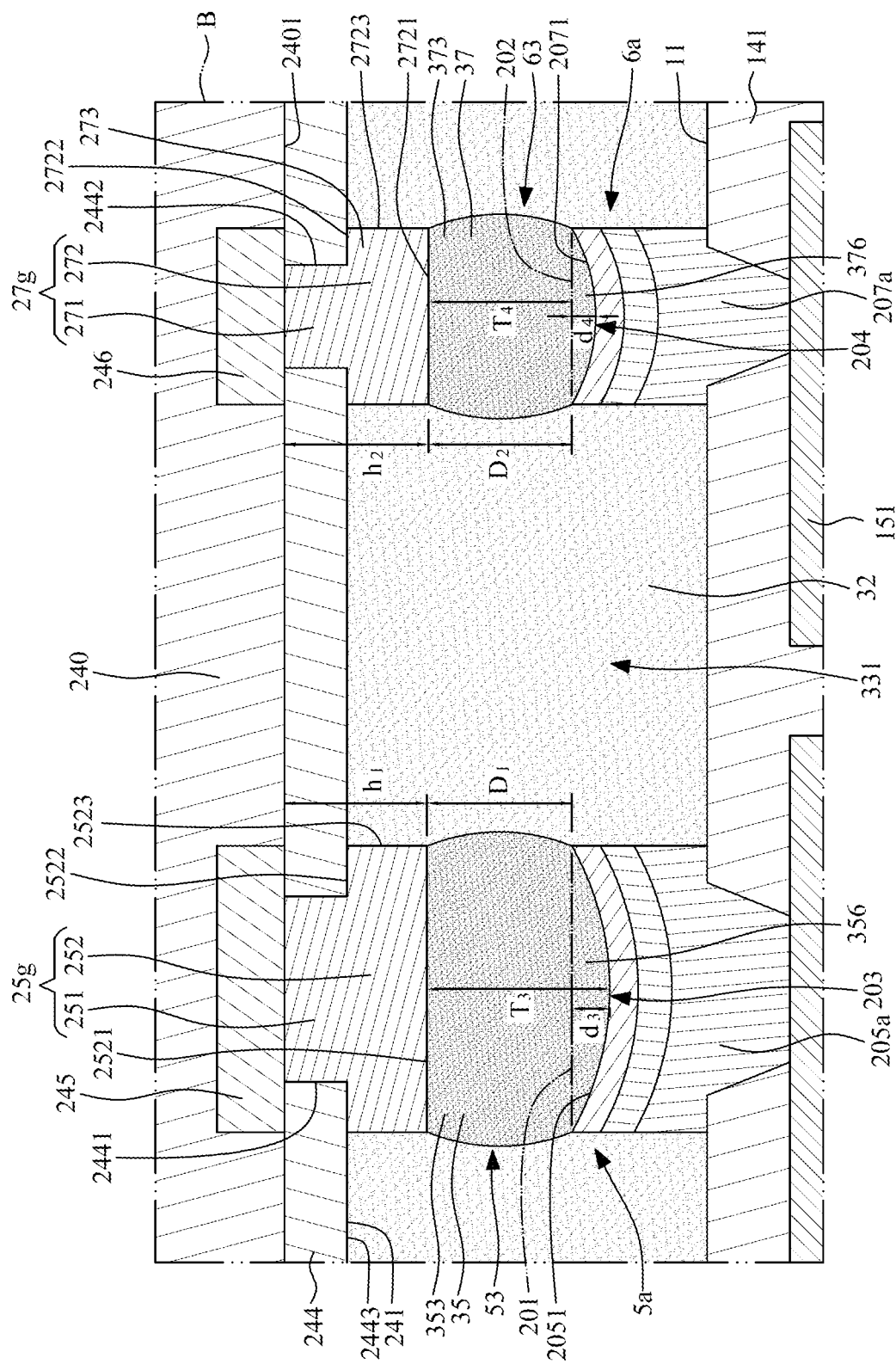
FIG. 5A illustrates an enlarged view of a region "B" in FIG. 5.

FIG. 5 illustrates a cross-sectional view of a package structure 3a according to some embodiments of the present disclosure. FIG. 5A illustrates an enlarged view of a region "B" in FIG. 5. The package structure 3a of FIGS. 5 and 5A is similar to the package structure 3 of FIG. 1 to FIG. 4, except for the structures of the first interconnection structure 5a, the first reflowable material 35, the second interconnection structure 6a and the second reflowable material 37. In the first interconnection structure 5a, the outer surface 2521 of the end portion 252 of the first bump 25g may be flat surface, the first electrical contact 205a may define a first recess portion 203 for accommodating the first extending portion 356 of the first reflowable material 35, and the first extending portion 356 of the first reflowable material 35 may be disposed in the first recess portion 203. The periphery edge of the first electrical contact 205a may define an imaginary horizontal plane 201. A depth (e.g., a maximum depth $d_3$) of the first recess portion 203 may be measured from the imaginary horizontal plane 201. The outer surface 2051 (e.g., a top surface) of the first electrical contact 205a may be a concave or curved surface. In the second interconnection structure 6a, the outer surface 2721 of the end portion 272 of the second bump 27g may be flat surface, the second electrical contact 207a may define a second recess portion 204 for accommodating the second extending portion 376 of the second reflowable material 37, and the second extending portion 376 of the second reflowable material 37 may be disposed in the second recess portion 204. The periphery edge of the second electrical contact 207a may define an imaginary horizontal plane 202. A depth (e.g., a maximum depth $d_4$) of the second recess portion 204 may be measured from the imaginary horizontal plane 202. The outer surface 2071 (e.g., a top surface) of the second electrical contact 207a may be a concave or curved surface. The depth (e.g., a maximum depth $d_3$) of the first recess portion 203 may be greater than depth (e.g., a maximum depth $d_4$) of the second recess portion 204, and the maximum thickness $T_3$ of the first reflowable material 35 is substantially greater than the maximum thickness $T_4$ of the second reflowable material 37.

Figure 5B:
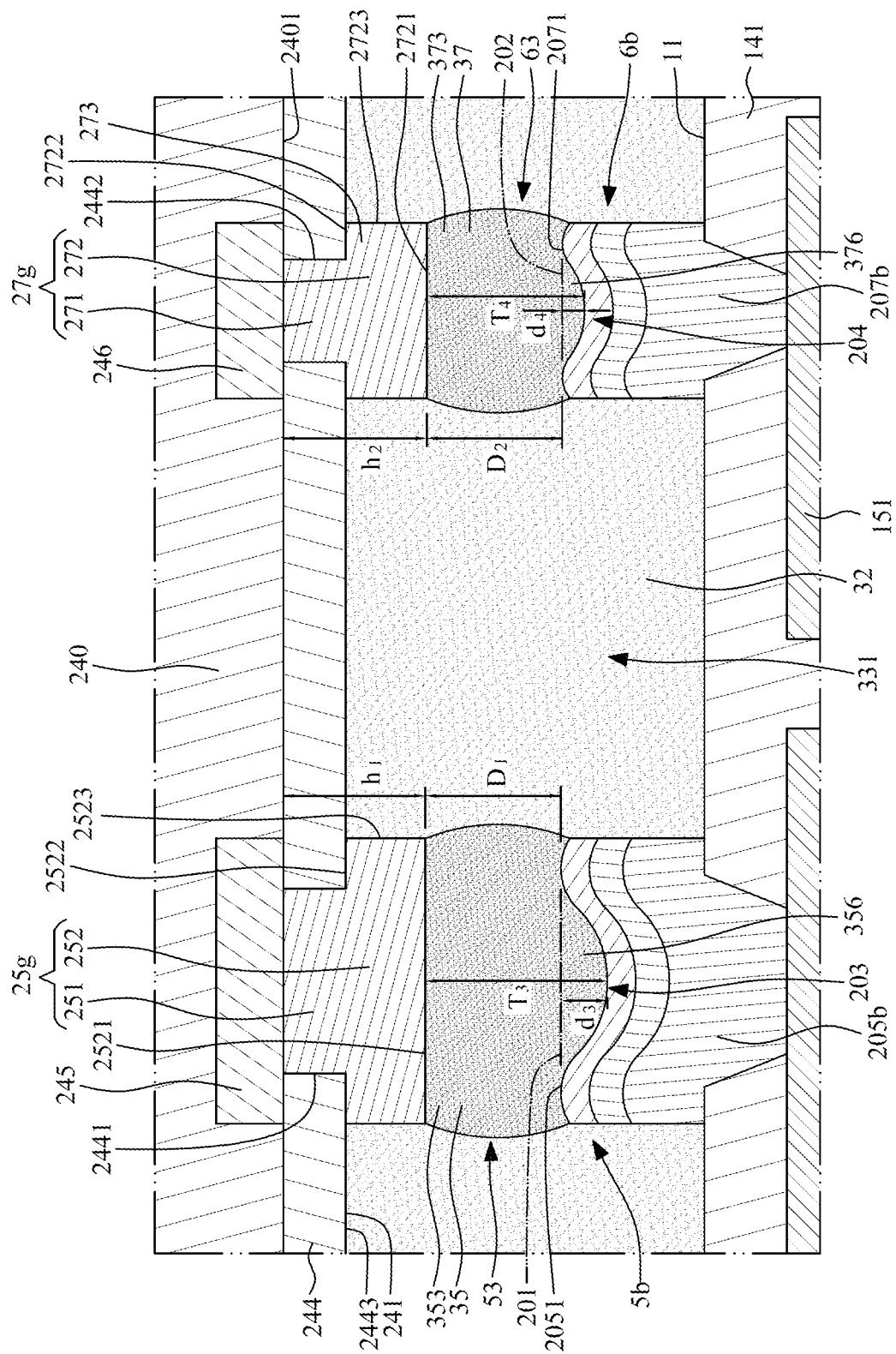
FIG. 5B illustrates an enlarged view of a region of a package structure according to some embodiments of the present disclosure.

FIG. 5B illustrates an enlarged view of a region of a package structure according to some embodiments of the present disclosure. The structure illustrated in FIG. 5B is similar to the structure illustrated in FIG. 5A, except for the structures of the first interconnection structure 5b, the first reflowable material 35, the second interconnection structure 6b and the second reflowable material 37. In the first interconnection structure 5b, the outer surface 2051 (e.g., a top surface) of the first electrical contact 205b may be a wavy surface. In the second interconnection structure 6b, the outer surface 2071 (e.g., a top surface) of the second electrical contact 207b may be a wavy surface.

Figure 6:
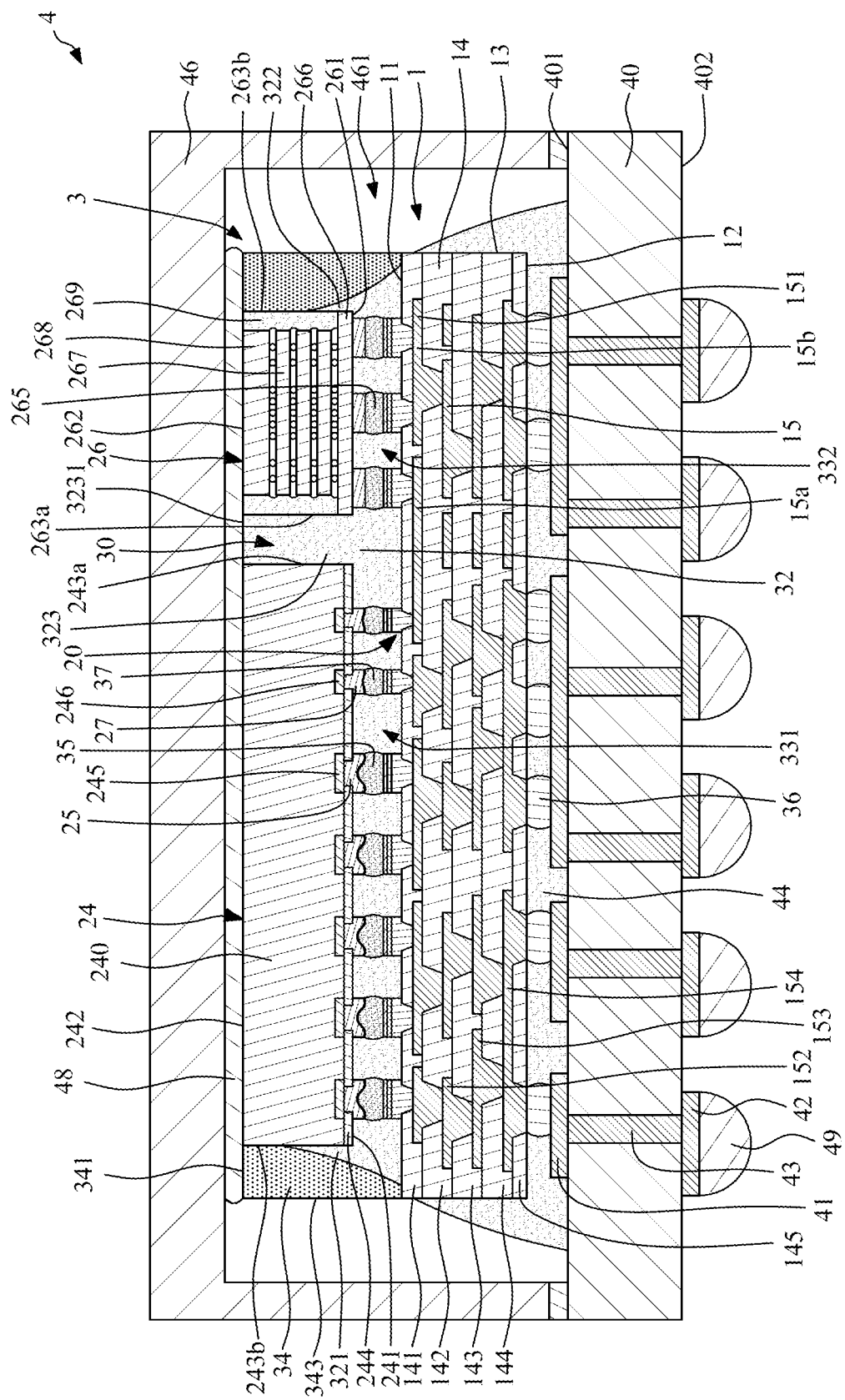
FIG. 6 illustrates a cross-sectional view of an assembly structure according to some embodiments of the present disclosure.

FIG. 6 illustrates a cross-sectional view of an assembly structure 4 according to some embodiments of the present disclosure. The assembly structure 4 may be a semiconductor package structure, and may include a base substrate 40, a package structure 3, a heat sink 46 and a plurality of external connectors 49. The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 6, the base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

The package structure 3 of FIG. 6 may be same as or similar to the package structure 3 of FIG. 1 to FIG. 4. The package structure 3 may be electrically connected to the first circuit layer 41 of the base substrate 40 through the solder materials 36. A protection material 44 (i.e., an underfill) may be further included in a space between the package structure 3 and the base substrate 40 so as to cover and protect the solder materials 36 and the first circuit layer 41. Further, the heat sink 46 may be a cap structure or a hat structure, and may define a cavity 461 for accommodating the package structure 3. A material of the heat sink 46 may include metal such as copper, aluminum, and/or other suitable material. A portion of the heat sink 46 may be attached to the top surface of the package structure 3 through a thermal material 48 (e.g., thermal interface material (TIM)) so as to dissipate the heat generated by the first electronic device 24 and the second electronic device 26. Another portion (e.g., bottom portion) of the heat sink 46 may be attached to the first surface 401 of the base substrate 40 through an adhesive material. In addition, the external connectors 49 (e.g., solder balls) are formed or disposed on the second circuit layer 42 for external connection.

Figure 7:
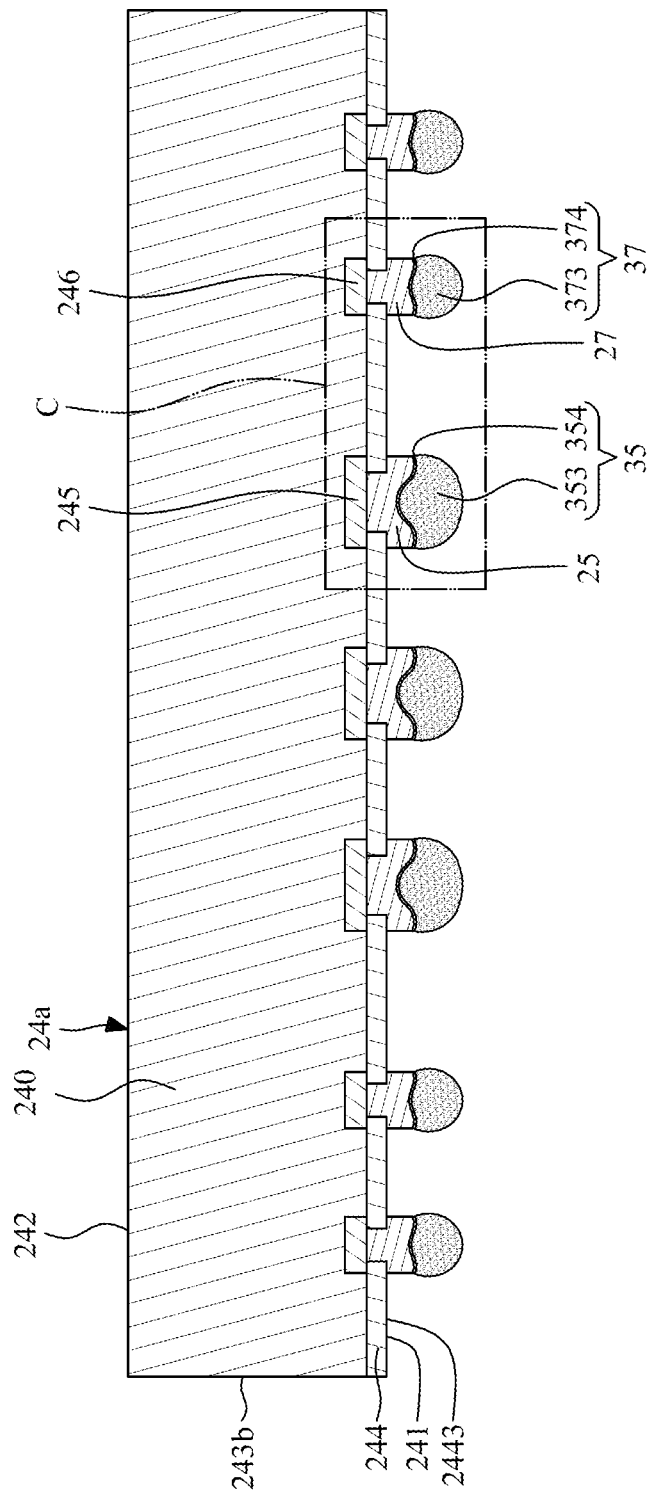
FIG. 7 illustrates a cross-sectional view of an electronic device according to some embodiments of the present disclosure.
Figure 7A:
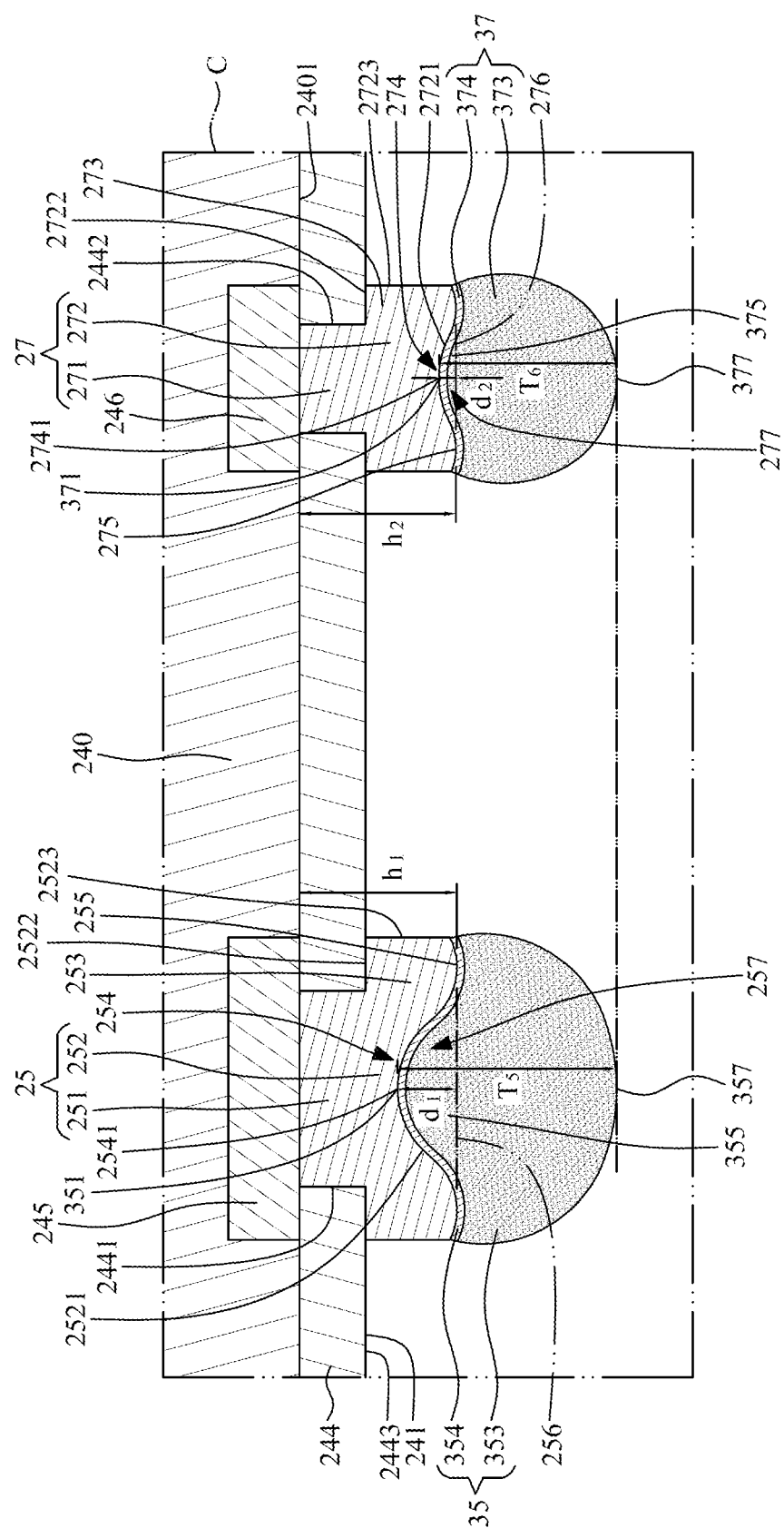
FIG. 7A illustrates an enlarged view of a region "C" in FIG. 7.

FIG. 7 illustrates a cross-sectional view of an electronic device 24a according to some embodiments of the present disclosure. FIG. 7A illustrates an enlarged view of a region "C" in FIG. 7. The electronic device 24a of FIGS. 7 and 7A is similar to the first electronic device 24 of FIG. 1 to FIG. 4, except that the electronic device 24a is not bonded to a wiring structure 1, and the second bumps 27 are around or surround the first bumps 25. As shown in FIG. 7A, the apex 357 of the first reflowable material 35 and the apex 377 of the second reflowable material 37 are free ends. Further, a first elevation of the apex 357 of the first reflowable material 35 is substantially equal to a second elevation of the apex 377 of the second reflowable material 37. For example, the first elevation of the apex 357 of the first reflowable material 35 with respect to the surface 2401 of the substrate 240 or the surface 2443 of the passivation layer 244 may be substantially equal to the second elevation of the apex 377 of the second reflowable material 37 with respect to the surface 2401 of the substrate 240 or the surface 2443 of the passivation layer 244. That is, the first accommodation space 257 may be configured to reduce the difference between the first elevation of the first reflowable material 35 and the second elevation of the second reflowable material 37 after a reflowing process. In some embodiments, the difference between the first elevation of the apex 357 of the first reflowable material 35 and the second elevation of the apex 377 of the second reflowable material 37 may be less than 15 μm or 10 μm. In addition, the maximum thickness $T_5$ of the first reflowable material 35 is substantially greater than the maximum thickness $T_6$ of the second reflowable material 37.

Figure 8:
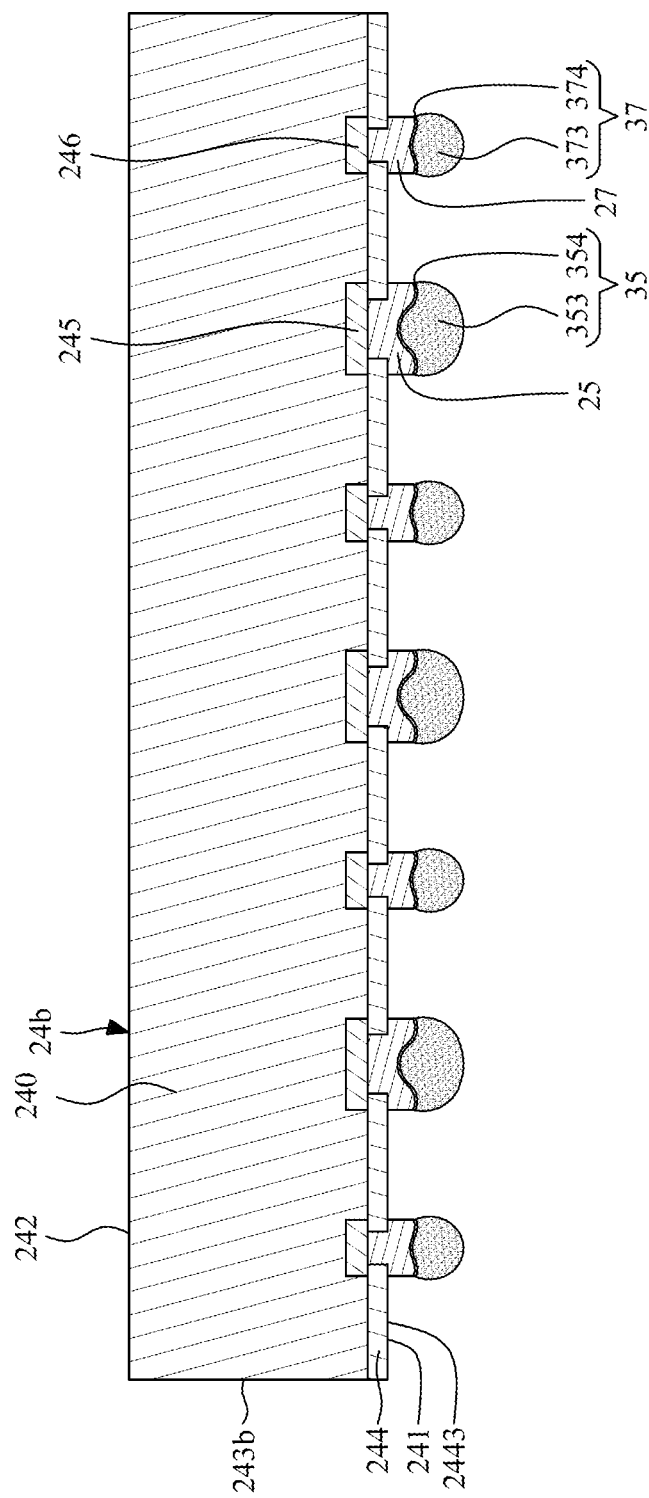
FIG. 8 illustrates a cross-sectional view of an electronic device according to some embodiments of the present disclosure.

FIG. 8 illustrates a cross-sectional view of an electronic device 24b according to some embodiments of the present disclosure. The electronic device 24b of FIG. 8 is similar to the electronic device 24a of FIG. 7, except that the second bumps 27 and the first bumps 25 are arranged alternatively.

Figure 9:
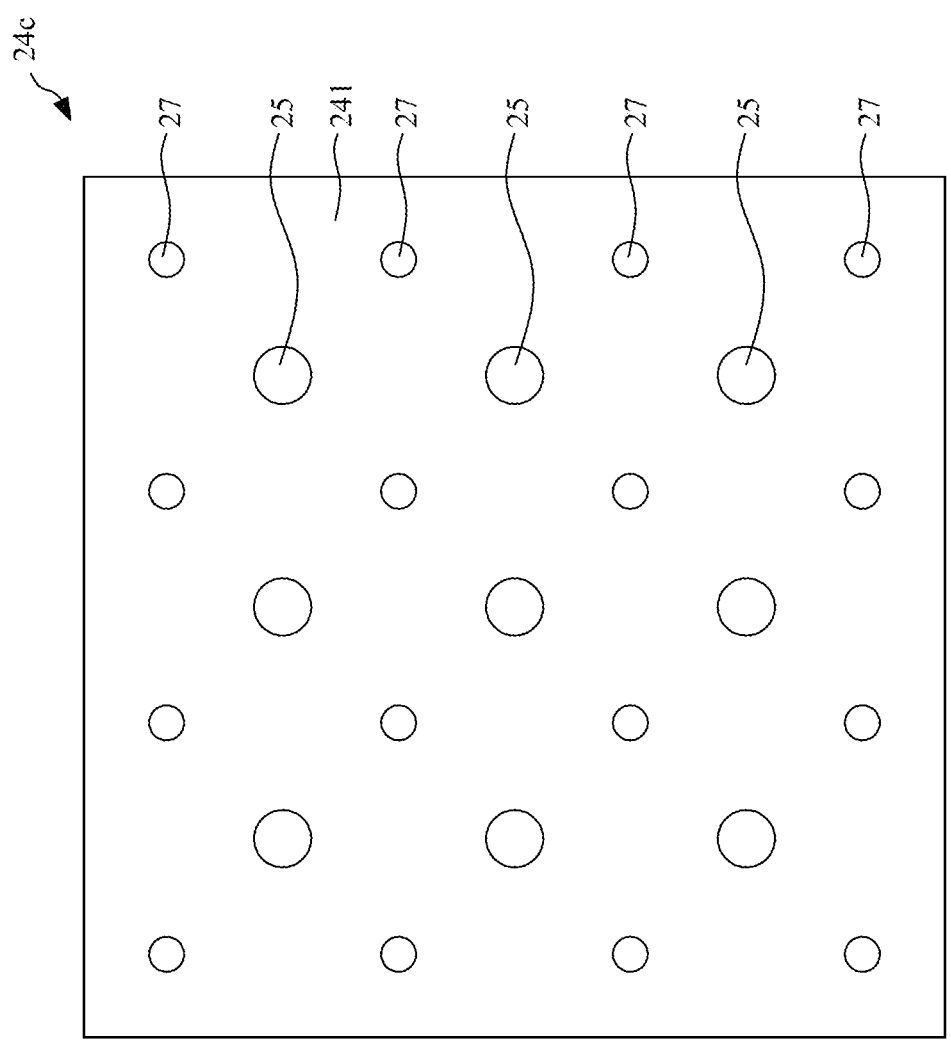
FIG. 9 illustrates a bottom view of an electronic device according to some embodiments of the present disclosure.

FIG. 9 illustrates a bottom view of an electronic device 24c according to some embodiments of the present disclosure. The electronic device 24c of FIG. 9 is similar to the electronic device 24a of FIG. 7, except that the second bumps 27 and the first bumps 25 are arranged in shift arrays. For example, a second bump 27 may be disposed at a center of four first bumps 25.

FIG. 10 through FIG. 21 illustrate a method for manufacturing an assembly structure according to some embodiments of the present disclosure. In some embodiments, the method is for manufacturing the first electronic device 24 and the package structure 3 shown in FIG. 1 to FIG. 4, and the assembly structure 4 of FIG. 6.

Figure 10:
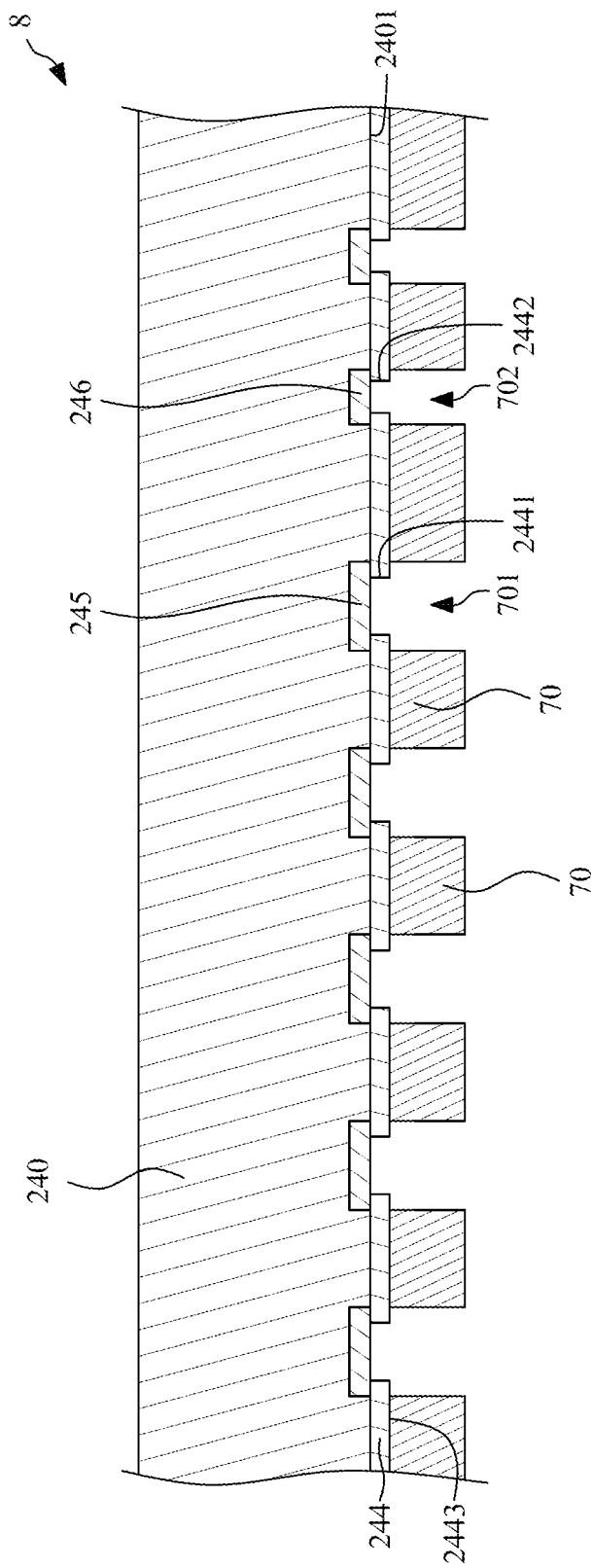
FIG. 10 illustrates one or more stages of an example of a method for manufacturing an assembly structure according to some embodiments of the present disclosure.

Referring to FIG. 10, a wafer 8 is provided. The wafer 8 may be circular, rectangular, square or elliptical. In some embodiments, the wafer 8 may be a silicon wafer. As shown in FIG. 10, the wafer 8 may include a substrate 240, a plurality of conductive pads (including, for example, at least one first conductive pad 245 and at least one second conductive pad 246) and a passivation layer 244. The first conductive pad 245 and the second conductive pad 246 may be disposed adjacent to and exposed from a surface 2401 of the substrate 240. The passivation layer 244 may be disposed on the surface 2401 of the substrate 240, and may define at least one first opening 2441 to expose the first conductive pad 245 and at least one second opening 2442 to expose the second conductive pad 246.

Then, a photoresist layer 70 may be formed or disposed on a surface 2443 of the passivation layer 244. The photoresist layer 70 may define at least one first opening 701 and at least one second opening 702. A width of the first opening 701 is greater than a width of the second opening 702. The first opening 701 of the photoresist layer 70 is communicated with the first opening 2441 of the passivation layer 244 to expose the first conductive pad 245. The second opening 702 of the photoresist layer 70 is communicated with the second opening 2442 of the passivation layer 244 to expose the second conductive pad 246.

Figure 11:
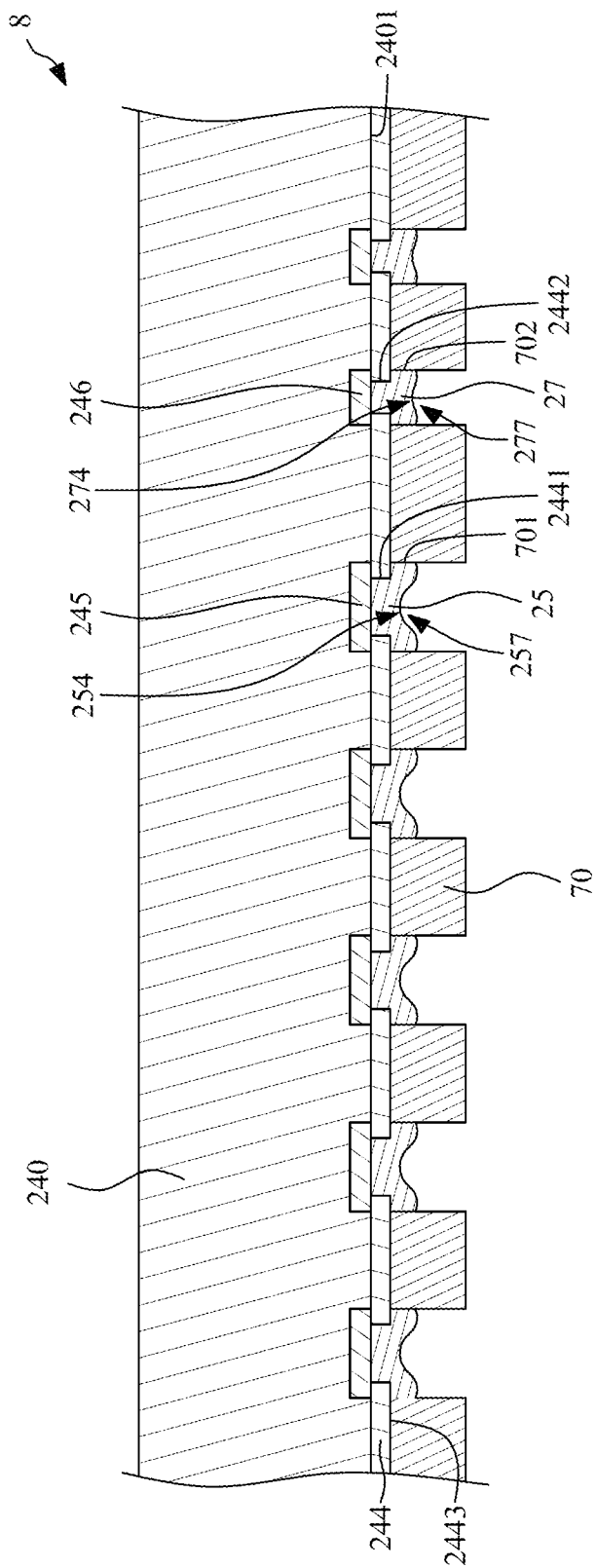
FIG. 11 illustrates one or more stages of an example of a method for manufacturing an assembly structure according to some embodiments of the present disclosure.

Referring to FIG. 11, a first bump 25 and a second bump 27 may be formed or disposed over the substrate 240 by, for example, an electroplating process. A portion of the first bump 25 may be disposed in the first opening 2441 and on the substrate 240 to electrically connect or physically contact the first conductive pad 245. A portion of the second bump 27 may be disposed in the second opening 2442 and on the substrate 240 to electrically connect or physically contact the second conductive pad 246. The second bump 27 has a width less than a width of the first bump 25.

In some embodiments, a ratio between accelerators and suppressors is controlled during the electroplating process so as to form a first recess portion 254 on the first bump 25 to define a first accommodation space 257 and form a second recess portion 274 on the second bump 27 to define a second accommodation space 277. For example, the suppressors in the copper plating solution has a relatively large molecular chain structure, and the accelerators in the plating solution has a relatively small molecular chain structure. Thus, the suppressors are difficult to enter the small sized second openings 702, 2442, and most of the suppressors are disposed in the large sized first openings 701, 2441. The accelerators on the sidewalls of the large sized first openings 701, 2441 may be crowded out or pushed out by the suppressors. As a result, a deep first recess portion 254 may be formed on the first bump 25 after the electroplating process. A depth of the first recess portion 254 may be greater than a depth of the second recess portion 274. In some embodiments, there may be no second recess portion 274 on the second bump 27, and the end portion 272 may be a convex surface or a center protruded surface.

Figure 12:
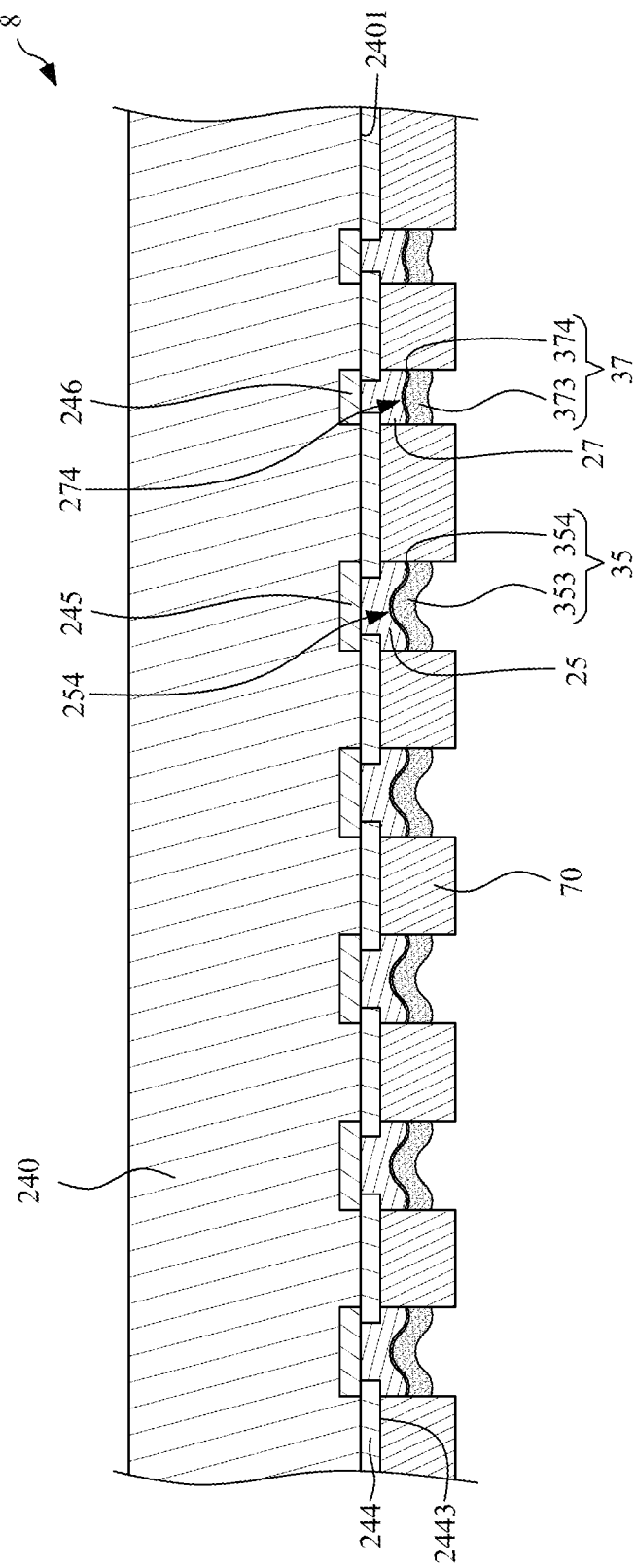
FIG. 12 illustrates one or more stages of an example of a method for manufacturing an assembly structure according to some embodiments of the present disclosure.

Referring to FIG. 12, a first reflowable material 35 is formed or disposed on the first bump 25 and in the first accommodation space 257, and a second reflowable material 37 is formed or disposed on the second bump 27 and in the second accommodation space 277 by, for example, an electroplating process. A thickness of the first reflowable material 35 may be substantially equal to a thickness of the second reflowable material 37.

Figure 13:
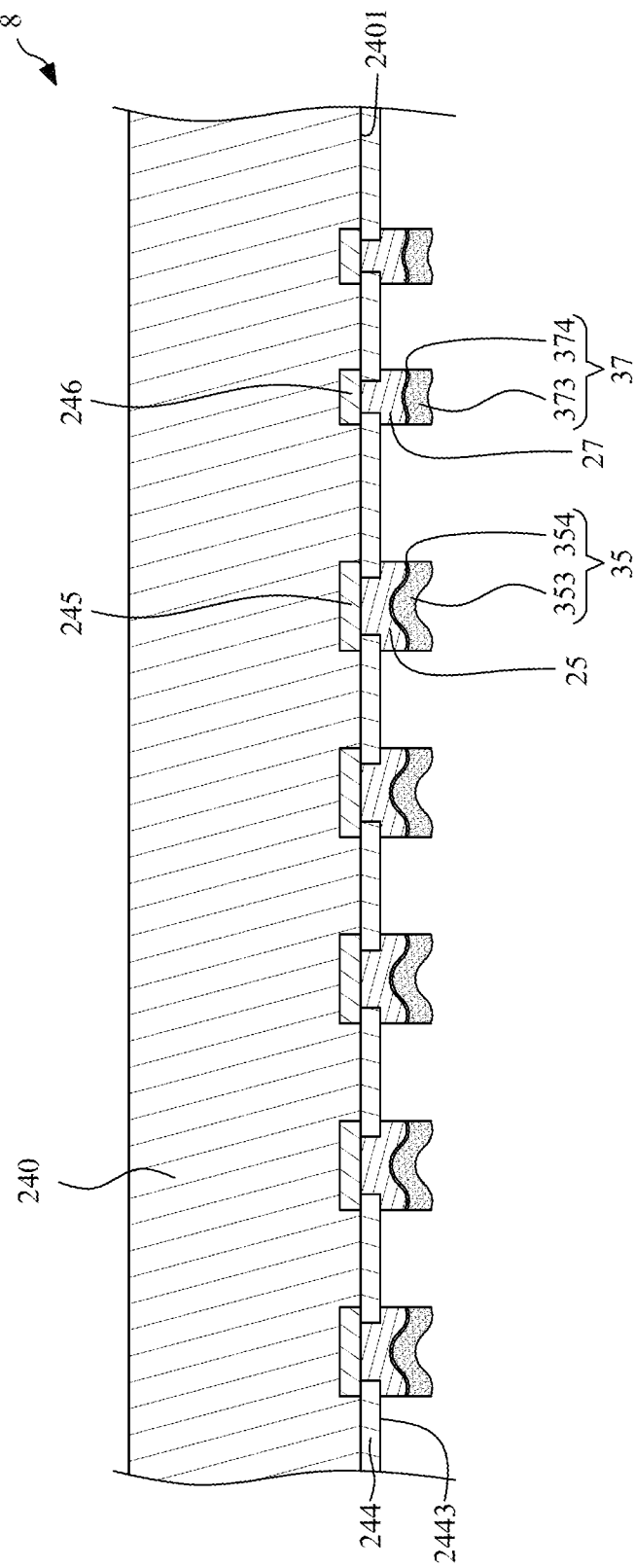
FIG. 13 illustrates one or more stages of an example of a method for manufacturing an assembly structure according to some embodiments of the present disclosure.

Referring to FIG. 13, the photoresist layer 70 may be removed.

Figure 14:
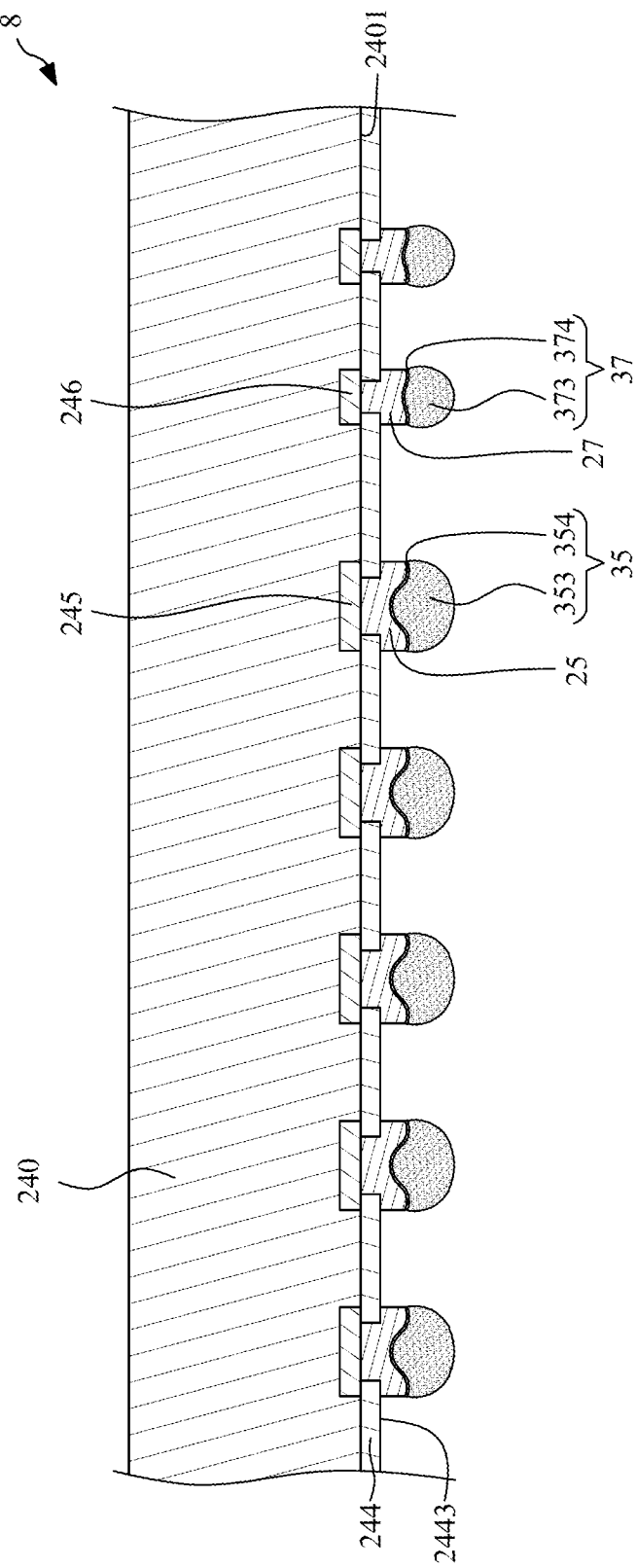
FIG. 14 illustrates one or more stages of an example of a method for manufacturing an assembly structure according to some embodiments of the present disclosure.

Referring to FIG. 14, a reflowing process is conducted. Meanwhile, the first reflowable material 35 and the second reflowable material 37 become sphere shapes due to the cohesion force. Because of the first accommodation space 257, the difference between a first elevation of the first reflowable material 35 and a second elevation of the second reflowable material 37 after a reflowing process is reduced, as shown in FIG. 7A. Then, a singulation process is conducted, so as to obtain the first electronic device 24 as shown in FIG. 2.

Figure 15:
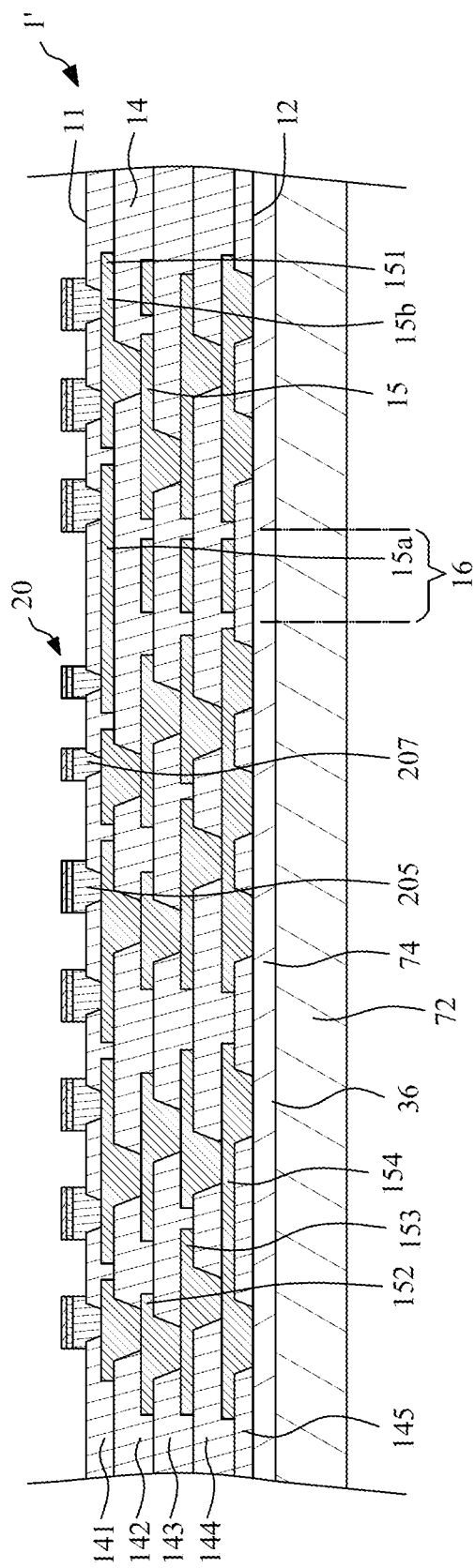
FIG. 15 illustrates one or more stages of an example of a method for manufacturing an assembly structure according to some embodiments of the present disclosure.

Referring to FIG. 15, a wiring structure 1' is formed or disposed on a release layer 74 on a carrier 72. The wiring structure 1' of FIG. 15 may be similar to the wiring structure 1 of FIG. 2 and FIG. 3, and may have a first surface 11, a second surface 12 opposite to the first surface 11, and a high density region 16 (or a fine line region). The wiring structure 1' may include at least one dielectric layer 14, at least one circuit layer 15 in contact with the dielectric layer 14 and a plurality of protrusion pads or electrical contacts 20 (including, for example, at least one first electrical contact 205 and at least one second electrical contact 207).

Figure 16:
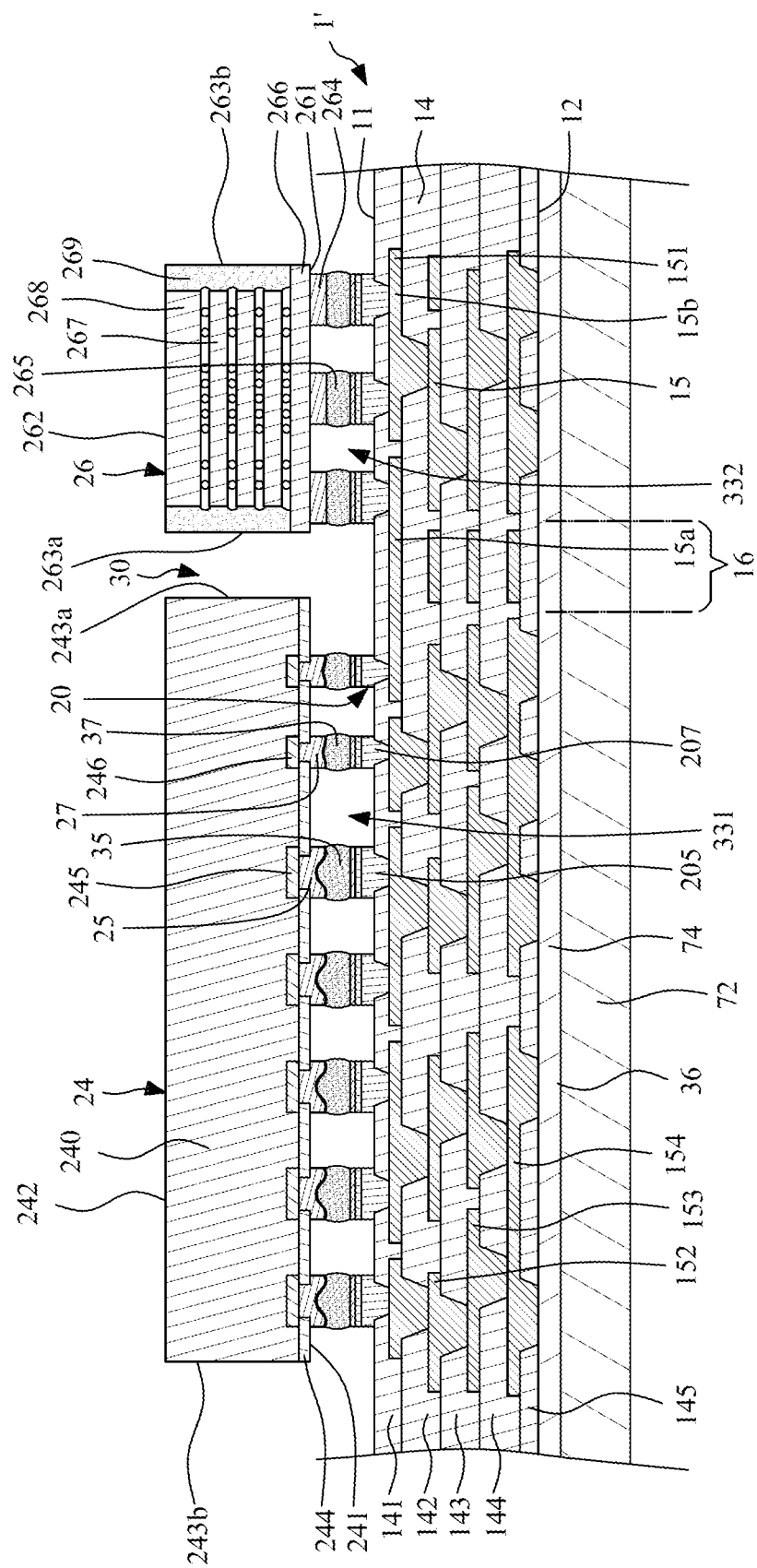
FIG. 16 illustrates one or more stages of an example of a method for manufacturing an assembly structure according to some embodiments of the present disclosure.

Referring to FIG. 16, a second electronic device 26 is provided. The second electronic device 26 of FIG. 16 may be similar to the second electronic device 26 of FIG. 2 and FIG. 3. Then, the first electronic device 24 and the second electronic device 26 are bonded to or electrically connected to the circuit layer 15 of the wiring structure 1' by flip-chip bonding. The first electronic device 24 is bonded to the wiring structure 1' through the first reflowable material 35 and the second reflowable material 37. During the flip-chip bonding of the first electronic device 24, all of the first reflowable materials 35 and the second reflowable materials 37 may contact the first electrical contacts 205 and the second electrical contacts 207, respectively. Thus, all of the first bumps 25 and the second the second bumps 27 may be securely bonded to the first electrical contacts 205 and the second electrical contacts 207, respectively. Thus, the quality of the bonding process is improved.

Figure 17:
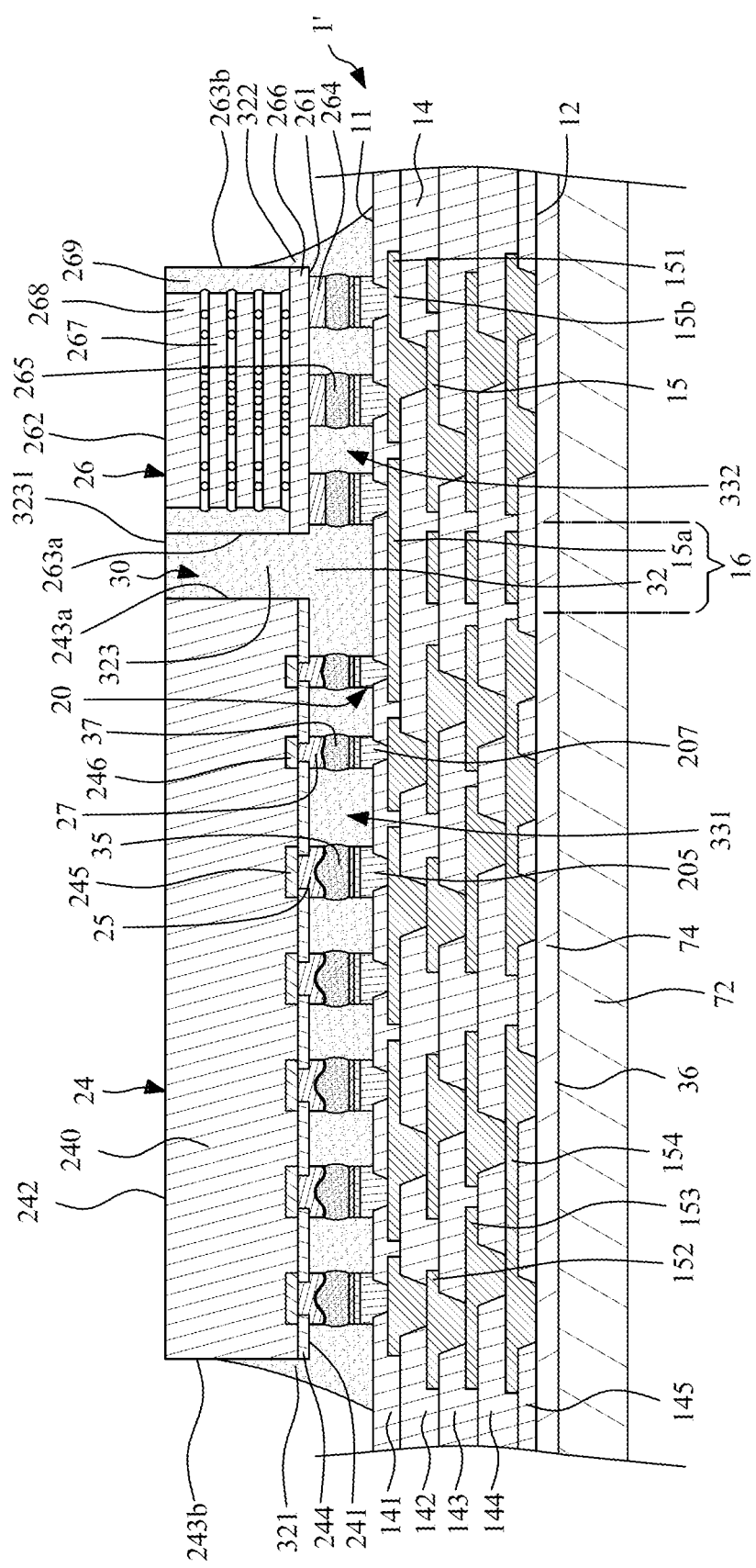
FIG. 17 illustrates one or more stages of an example of a method for manufacturing an assembly structure according to some embodiments of the present disclosure.

Referring to FIG. 17, a protection material 32 (i.e., an underfill) may be formed or disposed in a first space 331 between the first electronic device 24 and the wiring structure 1' so as to cover and protect the joints formed by the bumps (including, for example, at least one first bump 25 and at least one second bump 27), the reflowable material (including, for example, at least one first reflowable material 35 and at least one second reflowable material 37) and the electrical contacts 20 (including at least one first electrical contact 205 and at least one second electrical contact 207). Further, the protection material 32 may be disposed in a second space 332 between the second electronic device 26 and the wiring structure 1' so as to cover and protect the joints formed by the bumps 264, the solders 265 and the electrical contacts 20.

Figure 18:
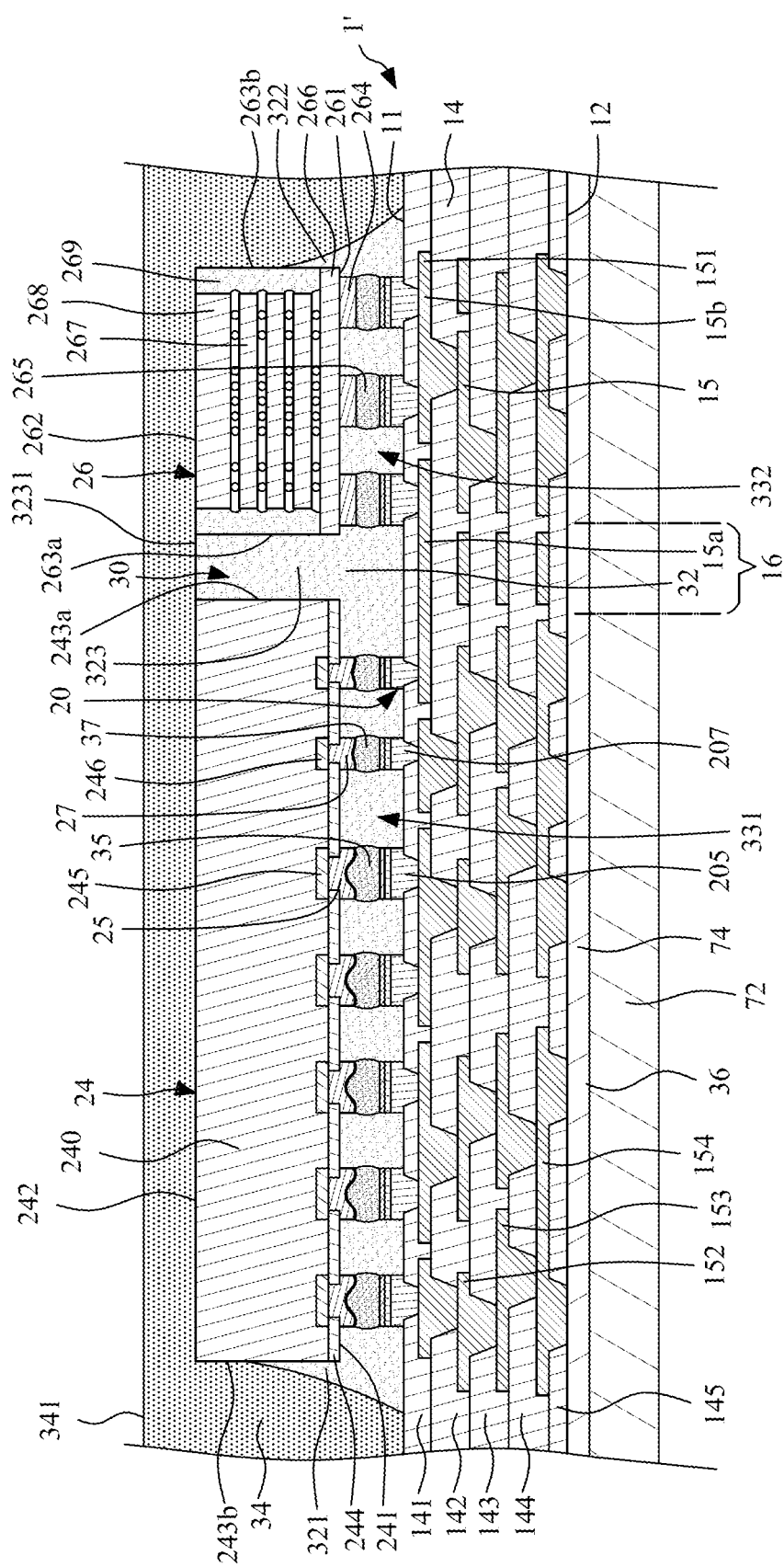
FIG. 18 illustrates one or more stages of an example of a method for manufacturing an assembly structure according to some embodiments of the present disclosure.

Referring to FIG. 18, an encapsulant 34 is formed or disposed to cover at least a portion of the first surface 11 of the wiring structure 1', at least a portion of the first electronic device 24, at least a portion of the second electronic device 26 and the protection material 32. The encapsulant 34 has a first surface 341 (e.g., a top surface).

Figure 19:
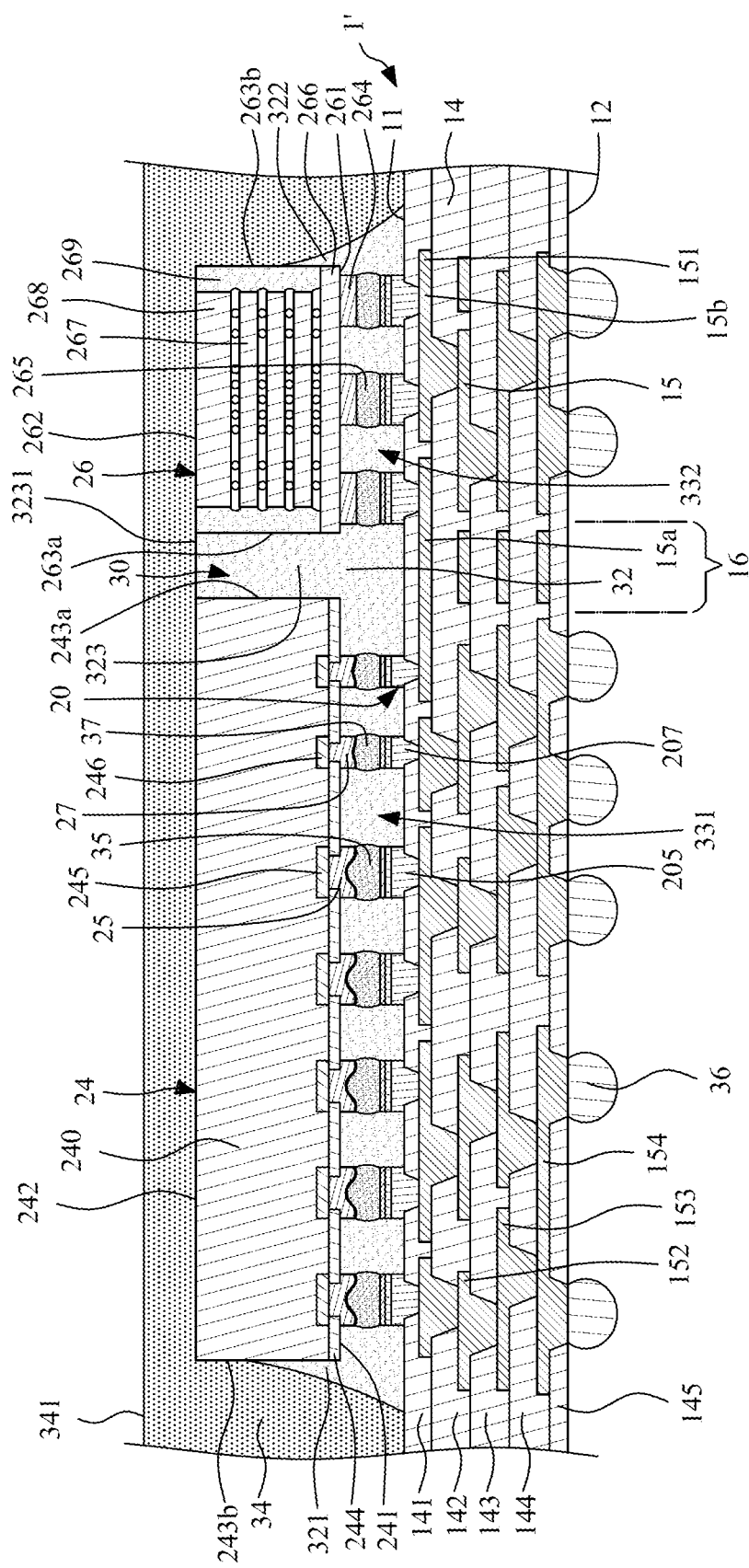
FIG. 19 illustrates one or more stages of an example of a method for manufacturing an assembly structure according to some embodiments of the present disclosure.

Referring to FIG. 19, the carrier 72 and the release layer 74 are removed. Thus, portions (i.e., the bottom portions of the via portions) of the fourth circuit layer 154 are exposed from the second surface 12 of the wiring structure 1'. Then, a plurality of solder materials 36 (e.g., solder balls) are formed or disposed on the second surface 12 of the wiring structure 1'. For example, the solder materials 36 may be disposed on the exposed portions (i.e., the bottom portions of the via portions) of the fourth circuit layer 154.

Figure 20:
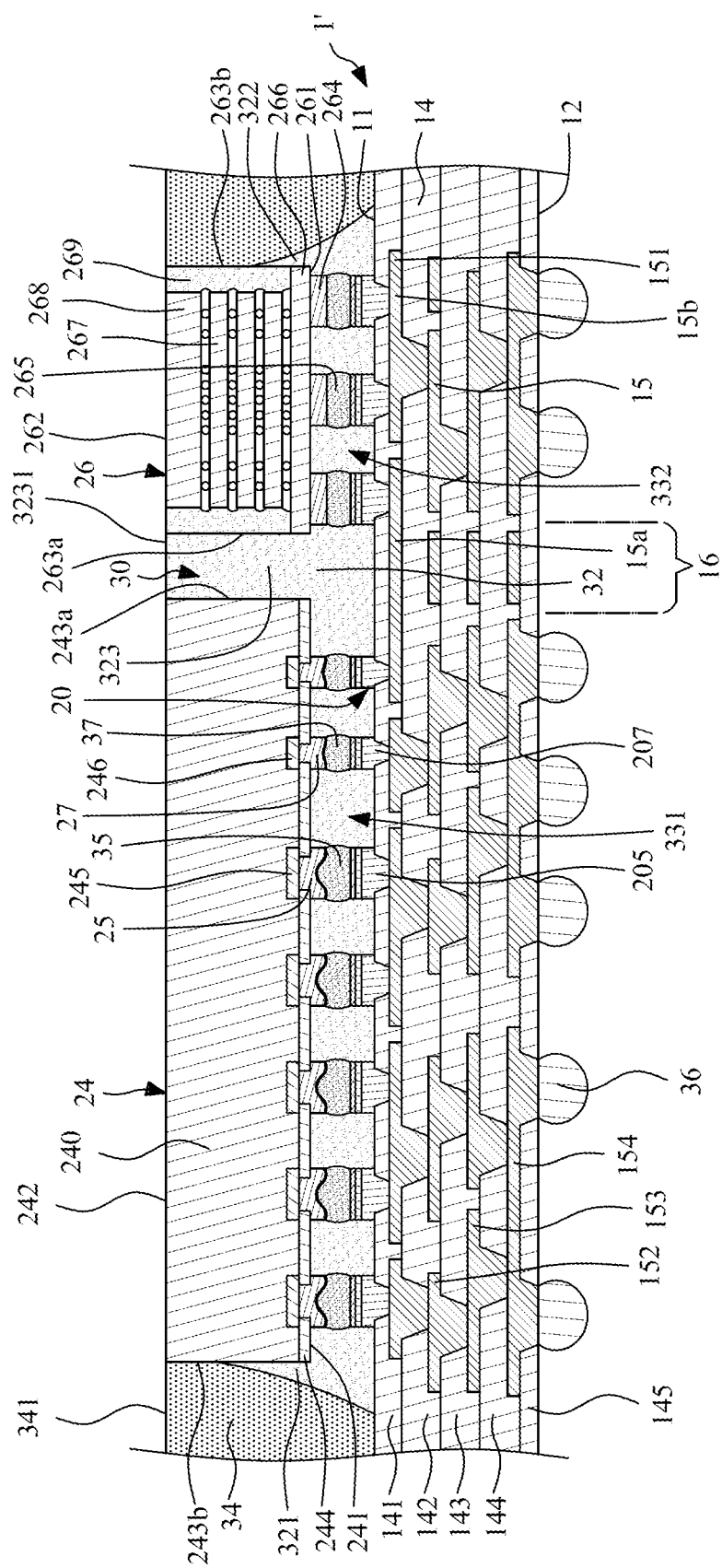
FIG. 20 illustrates one or more stages of an example of a method for manufacturing an assembly structure according to some embodiments of the present disclosure.

Referring to FIG. 20, the encapsulant 34 is thinned from its first surface 341 by, for example, grinding. Thus, the first surface 341 of the encapsulant 34, the second surface 242 of the first electronic device 24, the second surface 262 of the second electronic device 26 and the top surface 3231 of the third portion 323 of the protection material 32 may be substantially coplanar with each other. Then, a singulation process may be conducted to the wiring structure 1' so as to obtain a plurality of package structures 3 shown in FIG. 1 to FIG. 4.

Figure 21:
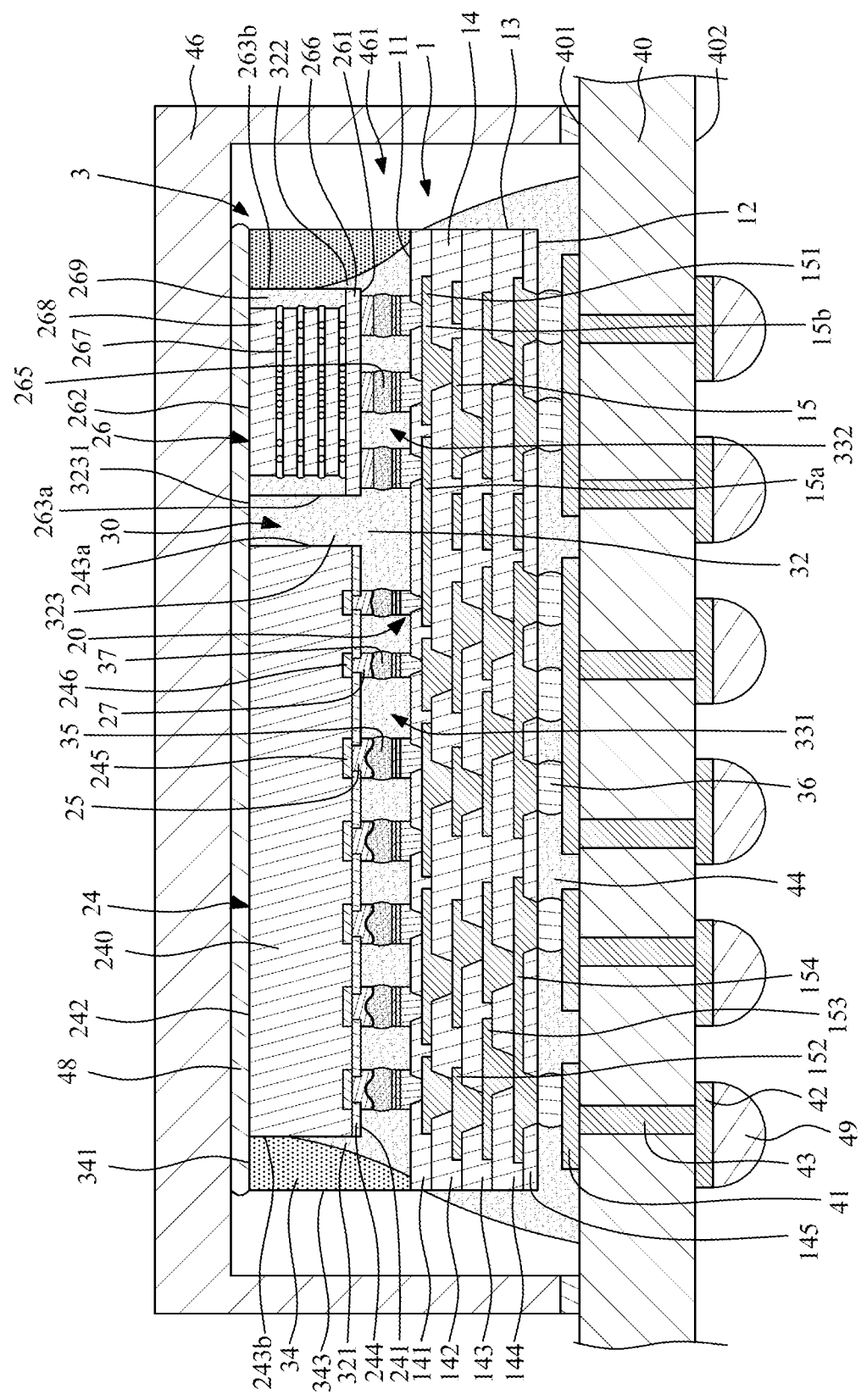
FIG. 21 illustrates one or more stages of an example of a method for manufacturing an assembly structure according to some embodiments of the present disclosure.

Referring to FIG. 21, the package structure 3 may be electrically connected to a first surface 401 of a base substrate 40 through the solder materials 36. Then, a protection material 44 (i.e., an underfill) is formed or disposed in a space between the package structure 3 and the base substrate 40 so as to cover and protect the solder materials 36. Then, a heat sink 46 may be attached to package structure 3 and the base substrate 40. In some embodiments, the heat sink 46 may be a cap or hat structure, and may define a cavity 461 for accommodating the package structure 3. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material.

Then, a singulation process may be conducted to the base substrate 40 so as to obtain a plurality of assembly structures 4 shown in FIG. 6.

Figure 22:
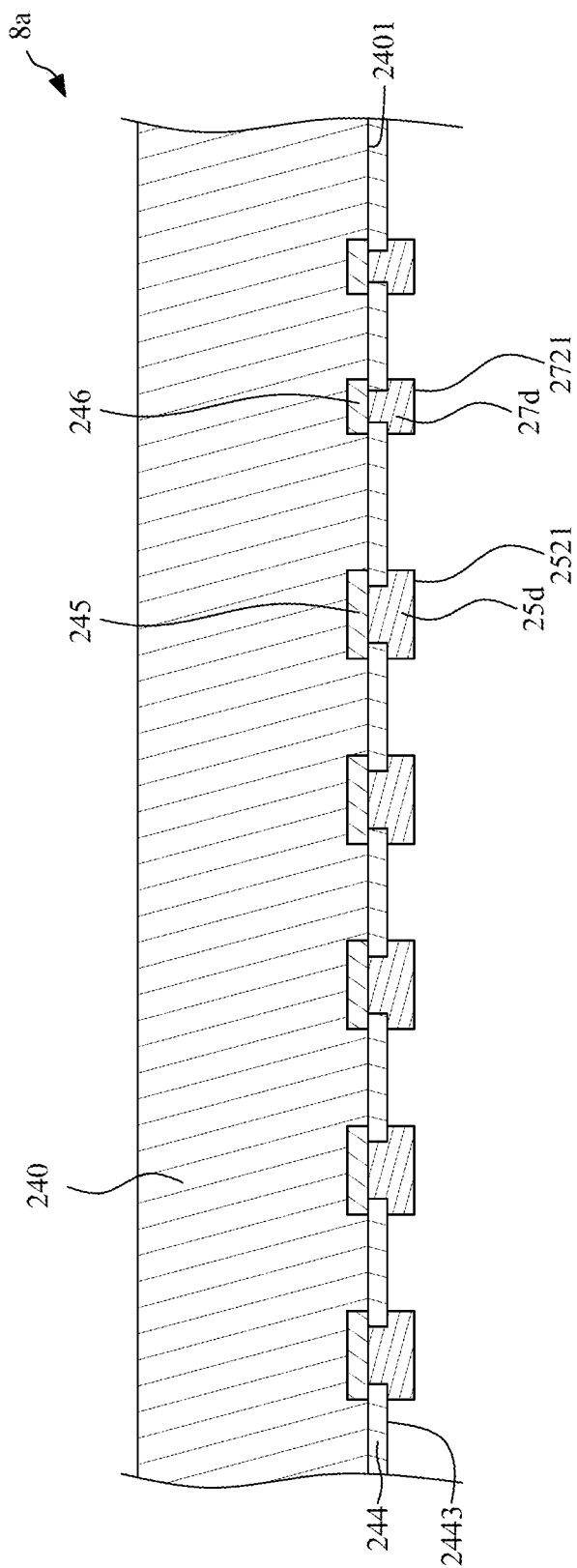
FIG. 22 illustrates one or more stages of an example of a method for manufacturing an electronic device according to some embodiments of the present disclosure.
Figure 23:
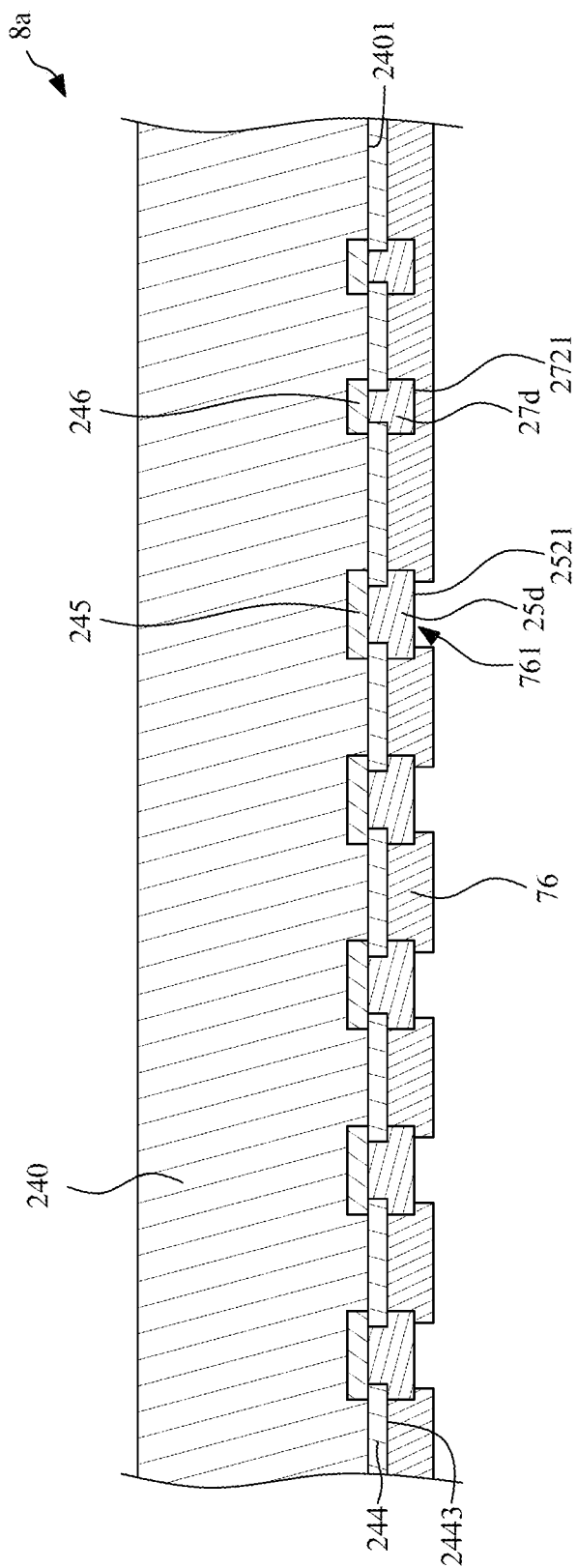
FIG. 23 illustrates one or more stages of an example of a method for manufacturing an electronic device according to some embodiments of the present disclosure
Figure 24:
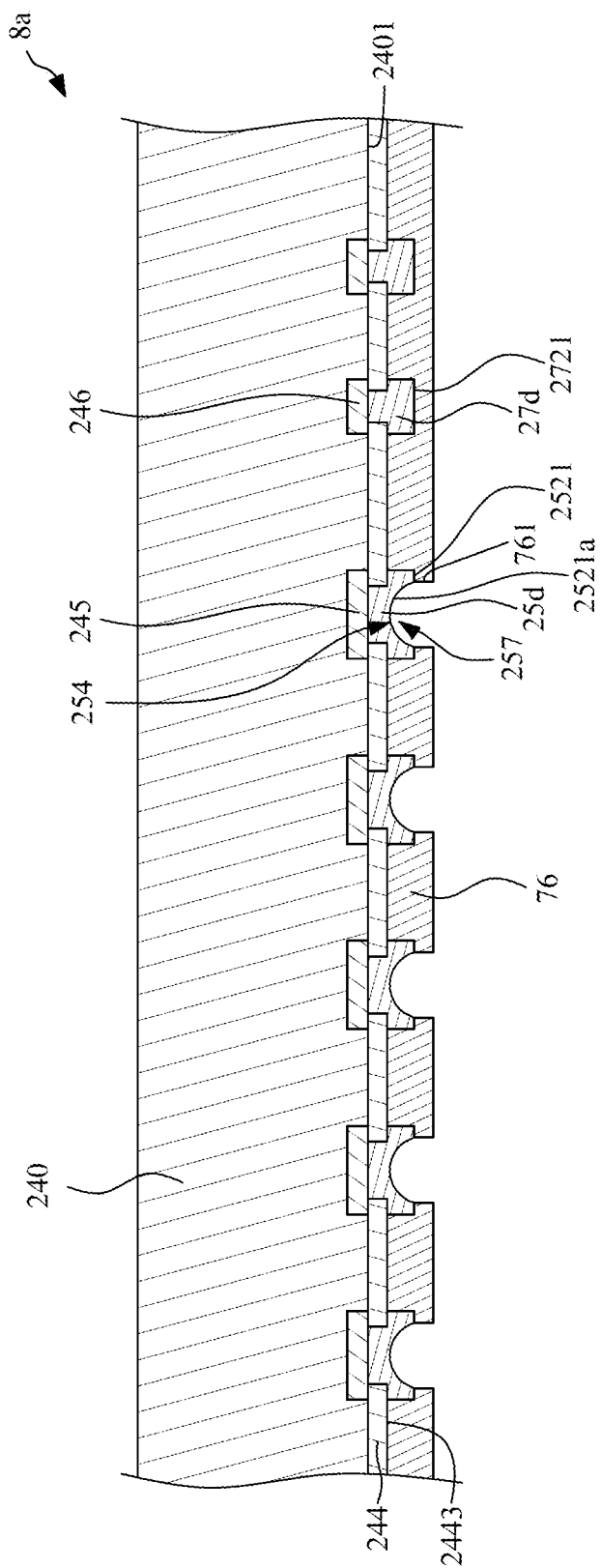
FIG. 24 illustrates one or more stages of an example of a method for manufacturing an electronic device according to some embodiments of the present disclosure.

FIG. 22 through FIG. 24 illustrate a method for manufacturing an electronic device according to some embodiments of the present disclosure. In some embodiments, the method is for manufacturing the electronic device including the structure shown in FIG. 4D.

Referring to FIG. 22, a wafer 8a is provided. The wafer 8a of FIG. 22 is similar to the wafer 8 of FIG. 10 except that the first bump 25d and the second bump 27d have been formed on the substrate 240 and the passivation layer 244. The outer surface 2521 of the end portion 252 of the first bump 25d may be a flat surface, and the outer surface 2721 of the end portion 272 of the second bump 27d may also be a flat surface.

Referring to FIG. 23, a photoresist layer 76 may be formed or disposed on a surface 2443 of the passivation layer 244 to cover the first bump 25d and the second bump 27d. The photoresist layer 76 may define at least one first opening 761 to expose a portion of the outer surface 2521 of the end portion 252 of the first bump 25d. It is noted that the outer surface 2721 of the second bump 27d is not exposed from the photoresist layer 76.

Referring to FIG. 24, the exposed portion of the outer surface 2521 of the end portion 252 of the first bump 25d may be removed by, for example, etching, so as to form the first recess portion 254 to define a first accommodation space 257.

Then, the photoresist layer 76 may be removed. Then, a first reflowable material 35 is formed or disposed on the first bump 25d and in the first accommodation space 257, and a second reflowable material 37 is formed or disposed on the second bump 27d. Then, a reflowing process is conducted. Then, a singulation process is conducted, so as to obtain the electronic device including the structure shown in FIG. 4D.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a substrate;
a first bump disposed over the substrate, and having a first width, wherein an end portion of the first bump defines a first recess portion; and
a second bump disposed over the substrate, and having a second width less than the first width, wherein an end portion of the second bump defines a second recess portion,
wherein a first periphery portion of the first bump is around the first recess portion.

2. The electronic device of claim 1, wherein the first periphery portion includes a first portion at a first side of the first recess portion and a second portion at a second side of the first recess portion, and a thickness of the first portion is different from a thickness of the second portion.

3. The electronic device of claim 1, further comprising a first conductive layer disposed on the first bump, wherein the first conductive layer includes a portion having a width decreasing toward the first bump.

4. The electronic device of claim 1, further comprising a second conductive layer disposed on the second bump, wherein the second conductive layer includes a portion having a width decreasing toward the second bump.

5. The electronic device of claim 1, further comprising a reflowable material disposed over the second bump.

6. The electronic device of claim 5, further comprising a third conductive layer disposed between the second bump and the reflowable material.

7. The electronic device of claim 6, wherein the third conductive layer has a top surface, and the top surface includes an upward convex surface.

8. The electronic device of claim 1, wherein a second periphery portion of the second bump is around the second recess portion, the second periphery portion includes a third portion at a third side of the second recess portion and a fourth portion at a fourth side of the second recess portion, and a thickness of the third portion is different from a thickness of the fourth portion.

9. An electronic device, comprising:
a substrate;
a first bump disposed over the substrate, and having a first width;
a second bump disposed over the substrate, and having a second width less than the first width; and
a passivation layer disposed on the substrate, and defining a first opening with a curved sidewall, wherein a portion of the first bump is disposed in the first opening, wherein the passivation layer defines a second opening having a curved sidewall, wherein a portion of the second bump is disposed in the second opening, wherein a width of the first opening is greater than a width of the second opening.

10. The electronic device of claim 9, wherein the first bump further includes an end portion disposed on the portion of the first bump and outside the first opening, and a thickness of the end portion is greater than a thickness of the portion of the first bump.

11. The electronic device of claim 10, wherein a thickness of the end portion is greater than a thickness of the passivation layer.

12. An electronic device, comprising:
a substrate;
a first bump disposed over the substrate, and having a first width, wherein a first end portion of the first bump defines a first recess portion; and
a second bump disposed over the substrate, and having a second width less than the first width, wherein a second end portion of the second bump has a curved surface, wherein the curved surface of the second end portion of the second bump includes a concave curved surface.

13. The electronic device of claim 12, wherein a lateral side surface of the first bump includes a curved surface, and a lateral side surface of the second bump includes a curved surface.

14. The electronic device of claim 12, further comprising a first conductive layer disposed on the first bump, wherein the first conductive layer includes a portion having a width decreasing toward the first bump.

* * * * *